(12) United States Patent
Atulasimha et al.

(10) Patent No.: US 10,957,372 B2
(45) Date of Patent: Mar. 23, 2021

(54) SWITCHING SKYRMIONS WITH VCMA/ELECTRIC FIELD FOR MEMORY, COMPUTING AND INFORMATION PROCESSING

(71) Applicant: VIRGINIA COMMONWEALTH UNIVERSITY, Richmond, VA (US)

(72) Inventors: Jayasimha Atulasimha, Glen Allen, VA (US); Dhritiman Bhattcaharya, Richmond, VA (US); Md Mamun Al-Rashid, Richmond, VA (US)

(73) Assignee: VIRGINIA COMMONWEALTH UNIVERSITY, Richmond, VA (US)

( * ) Notice: Subject to any disclaimer, the term of this patent is extended or adjusted under 35 U.S.C. 154(b) by 0 days.

(21) Appl. No.: 16/782,209

(22) Filed: Feb. 5, 2020

(65) Prior Publication Data
US 2020/0211612 A1     Jul. 2, 2020

Related U.S. Application Data

(62) Division of application No. 16/081,553, filed as application No. PCT/US2017/020148 on Mar. 1, 2017, now Pat. No. 10,593,389.

(60) Provisional application No. 62/301,749, filed on Mar. 1, 2016.

(51) Int. Cl.
*G11C 11/16*     (2006.01)
*G11C 11/56*     (2006.01)

(52) U.S. Cl.
CPC ........ *G11C 11/1675* (2013.01); *G11C 11/161* (2013.01); *G11C 11/1659* (2013.01); *G11C 11/1673* (2013.01); *G11C 11/5607* (2013.01)

(58) Field of Classification Search
CPC .............. G11C 11/1675; G11C 11/161; G11C 11/1659; G11C 11/1673; G11C 11/5607
See application file for complete search history.

(56) References Cited

U.S. PATENT DOCUMENTS 10,339,993 B1 * 7/2019 Schabes ................ H01F 41/307
2017/0033742 A1 * 2/2017 Akerman .............. G11C 11/161

* cited by examiner

*Primary Examiner* — Ajay Ojha
(74) *Attorney, Agent, or Firm* — W&C IP

(57) ABSTRACT

A fixed magnetic skyrmion in a memory or Boolean logic or non-Boolean computing element is reversibly switched or switchable (1) with only an electric field and without a magnetic field or spin current; and (2) using voltage control of magnetic anisotropy (VCMA) to reduce the spin current needed to switch the skyrmion. Some embodiments switch between four states: two skyrmion states and two ferromagnetic states. Other embodiments switch between two states which are both skyrmionic, in which case the switching process may use ferromagnetic intermediate states, or both ferromagnetic, in which case the switching process may use skyrmionic intermediate states, or between a Skyrmion and ferromagnetic state. Boolean and non-Boolean logic devices are also provided which are based on these switching methods.

26 Claims, 18 Drawing Sheets

SWITCHING SKYRMIONS WITH VCMA/ELECTRIC FIELD FOR MEMORY, COMPUTING AND INFORMATION PROCESSING

CROSS-REFERENCE TO RELATED APPLICATIONS

This application was filed as a divisional application of U.S. Ser. No. 16/081,553, filed Aug. 31, 2018, which itself was a Rule 371 filing from PCT/US2017/020148 filed Jan. 3, 2017, which claimed priority to U.S. Ser. No. 62/301,749 filed Jan. 3, 2016.

This invention was made with government support under CCF1253370 awarded by the National Science Foundation (NSF). The government has certain rights in the invention.

FIELD OF THE INVENTION

The invention generally relates to memory, computing, and information processing and, more particularly, memory, logic and neuromorphic devices and switching schemes involving fixed skyrmion states.

BACKGROUND

The ongoing quest for high density and high speed nanomagnetic computing devices has led to the exploration of novel materials, devices and switching strategies. A topologically protected spiral spin structure called skyrmion has attracted attention due to its potential use as such devices. Skyrmions were first proposed to explain hadrons. Later theories predicted the existence of magnetic skyrmions in the chiral helimagnets. Subsequently, experiments showed the evidence of skyrmion lattices in bulk and thin film. Dzyaloshinskii-Moriya interaction (DMI) that is present in non-centrosymmetric magnets or thin films interface with a metal with large spin orbit coupling, stabilizing the skyrmion state. Several schemes have been investigated to design racetrack memories and logic gates by manipulating the motion of a nonstationary skyrmion because the pinning current is orders of magnitude less than that of domain walls. Core reversal induced by microwave, magnetic field, spin current, and conversion between Skyrmion and ferromagnetic state using Scanning Tunneling Microscope tip and combination of electrical and magnetic fields have been shown.

US 2016/0314827A1, titled "A Memory Device, Comprising at Least One Element and Associated Method Spintronics," describes a memory device comprising a spintronic element having states associated with sets of magnetic skyrmions. The generation and the stabilization of a set of magnetic skyrmions is produced by either local application of a spin-polarized current or by applying a local electric field. A local magnetic field is applied to allow stabilization of the skyrmions.

WO 2016/158230A1, titled "Skyrmion generation device, skyrmion generation method, and magnetic memory device," describes applying an electric field to an insulating thin film magnetic body while a magnetic field is also applied.

WO 2016/002806A1, titled "Magnetic Element, Skyrmion Memory, Solid-State Electronic Device, Data Recording Device, Data Processor and Communication Device," describes a skyrmion memory circuit in which a current is applied in a closed-channel shaped magnetic body, the skyrmions transfer in direction perpendicular to the direction of the applied current, and the skyrmions are caused to circle within the closed-channel shaped magnetic body.

US 2011/0261602A1, titled "Magnetic Memory Devices and Systems," describes storing bits of information encoded in a topology of a domain wall of a magnetic bubble. The reference discusses providing stable magnetic bubbles with high perpendicular anisotropy structures such as nano-dots and without a need for an additional external bias field. The value of the bit stored by a magnetic bubble is changed by applying a magnetic field gradient pulse or an electrical current excitation.

The above described references, among others, tend to require moving skyrmions which have large footprints, spin currents to switch states which have relatively large energy dissipations, or external magnetic fields to stabilize skyrmions which add complexity and size. These and other disadvantages of existing devices and methods promote the need for novel skyrmion based memory, logic and neuromorphic devices.

SUMMARY

Nanomagnetic memory, logic and neuromorphic devices are usually based on switching the magnetization orientation of a ferromagnet. Traditional nanomagnetic computing devices are implemented with shape anisotropic nanomagnets (e.g., an elliptical shape) or materials with perpendicular magnetic anisotropy (PMA). Embodiments herein improve upon such prior devices by providing fixed skyrmion based devices/techniques or fixed skyrmion mediated switching devices and computing techniques. Switching can be accomplished (1) with only voltage control of magnetic anisotropy (VCMA) and without the need for a magnetic field or spin current; and (2) with VCMA assistance to reduce the spin current needed to switch during a spin transfer torque (STT) technique but without the need for a magnetic field.

Switching schemes disclosed herein may be used (1) to build energy efficient nanomagnetic memory elements which are at least 1-2 orders of magnitude more energy-efficient than existing nanomagnetic memory technologies and (2) to build Boolean and non-Boolean logic elements for implementing spin-neurons or synaptic devices. To manufacture some embodiments, only a small change to the manufacturing process is required: e.g., adding a heavy metal layer to create interfacial Dzyaloshinskii-Moriya Interaction (DMI) that forms magnetic skyrmions in the free layer of an MTJ. Fixed skyrmion switching methods disclosed herein may have faster response (higher clock speeds), larger density, and greater energy efficiency than moving (i.e., nonstationary) skyrmion technologies.

According an aspect of the invention, embodiments are disclosed for skyrmion core-reversal, skyrmion mediated ferromagnetic state reversal, and switching between skyrmion and ferromagnet states. Methods of switching between skyrmion and ferromagnet state, and ferromagnetic and skyrmion reversal disclosed herein are much more energy efficient than conventional STT-RAM. Skyrmion core-reversal, skyrmion mediated ferromagnetic state reversal, and switching between skyrmion and ferromagnet states can be used to implement energy-efficient non-volatile memory, logic and neuromorphic devices, including ultradense memory devices with readout integrated to an MTJ. Non-boolean and neuromorphic computing functionalities can also be achieved with such skyrmions to process higher order information such as non-Boolean logic operation and brain-like computing. Inherent non-volatility and low switching energy in these devices makes them an ideal candidate in applications with massive memory requirement such as web servers, big data and cloud computing. They are also well suited to regular computing devices such as desktops and laptops. These features in combination with the ability to use them for Boolean and non-Boolean computing can be ideally suited for processors in ubiquitous electronics such as medical processors for pattern recognition, structural health monitoring, security applications such as face recognition, and other applications.

According to one aspect of some exemplary embodiments, new switching schemes are provided for a skyrmion core which is completely voltage controlled (i.e., no bias magnetic field is required). This contrasts with existing processes that use magnetic field or spin current for reversal which consume a lot of energy. Furthermore, one of the present schemes can reversibly switch between four states: two skyrmion states and two ferromagnetic states.

In some embodiments herein, a hybrid scheme is provided where application of a small voltage reduces the threshold current needed for reversal of skyrmions. FR loss in pure spin current induced magnetization reversal can be considerably large. Reducing this loss requires reduction of the switching current, which can be achieved by employing methods to reduce perpendicular magnetic anisotropy (PMA), which temporarily depresses the energy barrier between the "up" and "down" state during spin current induced switching. This can improve the energy-efficiency and switching speed without compromising the thermal stability of the nanomagnet based computing device.

DETAILED DESCRIPTION

Figure 1A:
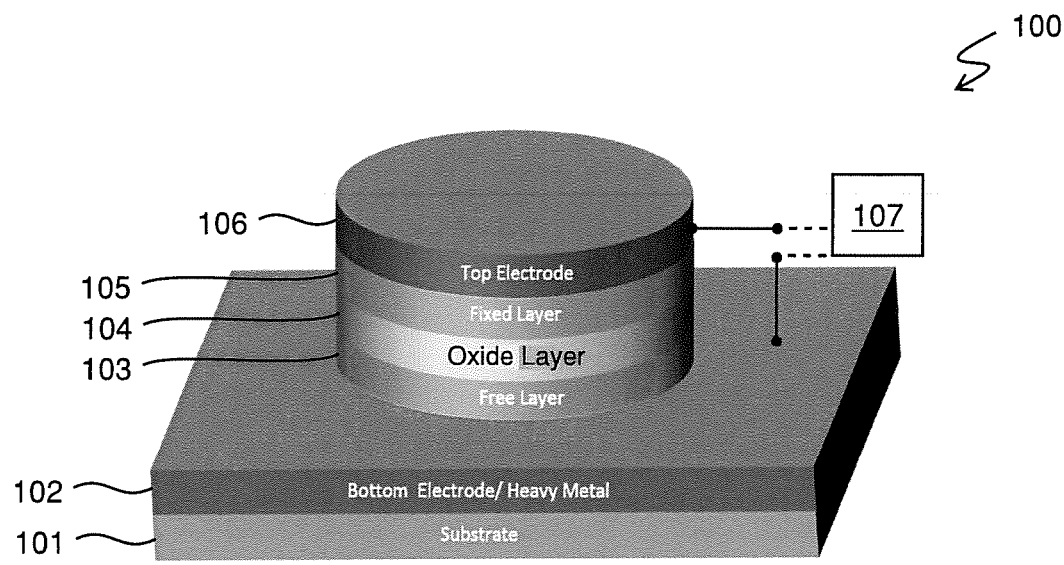
FIG. 1A is a simplified MTJ structure configured to read/write skyrmion states and ferromagnet states.
Figure 1B:
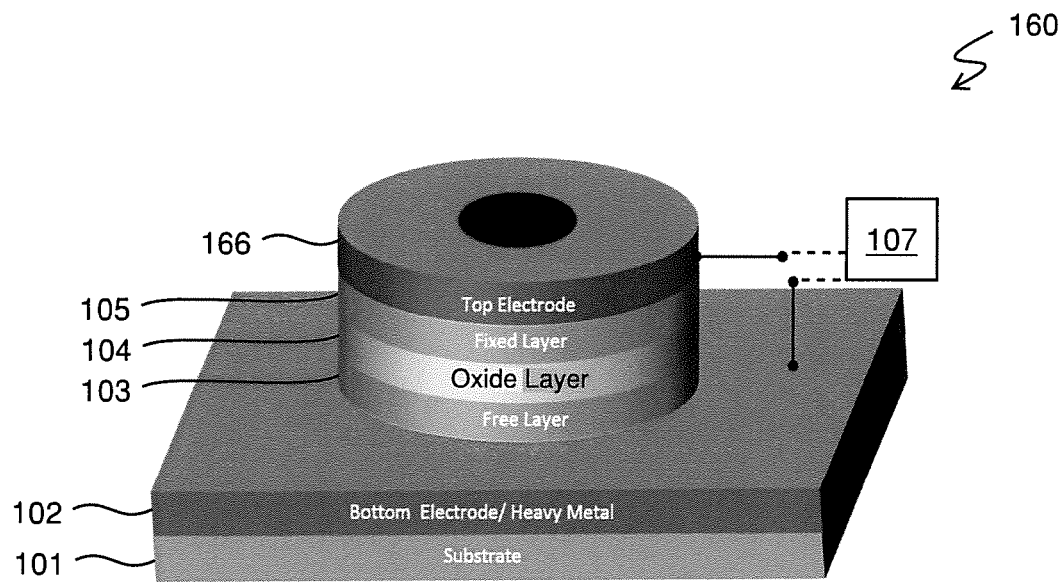
FIG. 1B is a simplified MTJ structure configured to read only the skyrmion periphery.

FIGS. 1A and 1B show exemplary magnetic tunnel junction (MTJ) structures 100 and 160, respectively, to read and write different magnetic states in the course of performing memory operations. The figures are simplified and do not depict, for example, synthetic antiferromagnetic layers which may be included in the MTJ structures. The structures 100 and 160 improve upon the traditional MTJ structure. Perpendicular magnetic anisotropy (PMA) is provided by an oxide layer to free layer interface, and a ferromagnet/heavy metal interface (free layer to heavy metal interface) gives rise to Dzyaloshinskii-Moriya Interaction (DMI). Together, these interactions stabilize the magnetic skyrmions in the free layer of the MTJ. Note that only one skyrmion exists in the free layer at a time, but the free layer is able to assume different skyrmion states at different times (e.g., core-up and core-down). The structures 100 and 160 are suited for writing operations using only VCMA or, in some embodiments, a combination of VCMA and STT. The structures 100 and 160 are suited for reading operations according to conventional MTJ reading operations.

FIG. 1A shows a MTJ structure 100 that has a top electrode 106, a fixed layer 105, a spacer layer/tunneling barrier which is typically an oxide layer (e.g., MgO) 104, and a free layer 103. MgO is but one exemplary material for layer 104, and alternatives to MgO may be used in different embodiments. The top electrode 106 is circular and continuous, e.g., it has no hole. However, the shape of the electrode 106, the other layers of the MTJ, and the MTJ itself may take alternative shapes such as, for example, elliptical or polygonal. The bottom boundary of the free layer 103 contacts a heavy metal layer 102, which doubles as a bottom electrode in some embodiments. As an alternative, the heavy metal layer may be a distinct layer between the free layer 103 and the bottom electrode. Heavy metals which heavy metal layer 102 may include or consist of include but are not limited to Tantalum (Ta), Platinum (Pt), Tungsten (W), Hafnium (Hf), and Iridium (Ir). A mechanism 107 such as circuitry may be included for controlling electrical signals to the electrodes (e.g., for applying a voltage waveform across the fixed layer, oxide layer, and free layer to temporarily change the perpendicular magnetic anisotropy (PMA)).

The MTJ structure 100 is manufactured atop a substrate 101. The fixed layer 105 has a permanent magnetic state, which may be either ferromagnetic or skyrmionic. For embodiments with a ferromagnetic fixed layer, the magnetic state of the fixed layer 105 is permanently either ferromagnetic up or ferromagnetic down. For embodiments with a skyrmionic fixed layer, the magnetic state of the fixed layer 105 is permanently either skyrmionic core-up or skyrmionic core-down. The adjective "fixed" in the context of a "fixed layer" implies that the layer has a permanent magnetic state. An alternative naming of the fixed layer which may be substituted therefore is "hard layer". (In contrast, a free layer may be referred to alternatively as a "soft layer".) The adjective "fixed" has a different meaning when used in the expression "fixed skyrmion".

The use of fixed skyrmions is a unique aspect of many embodiments of the invention. Prior work focuses on manipulation of the motion of skyrmions to store information or perform computing. A magnetic skyrmion is a topologically protected spiral spin structure which can be found in bulk materials with non-inversion symmetry as well as thin films interfaced with a heavy metal with high spin orbit coupling. Skyrmions that move about the plane of a thin film in which they exist are not fixed skyrmions. Fixed skyrmions, so long as they exist, maintain substantially the same center location over time. For this reason fixed skyrmions may be interchangeably referred to as stationary skyrmions. The controlled switching of fixed skyrmions within magnetic memory and logic elements is a distinct improvement over prior technologies using non-fixed skyrmions. Fixed skyrmions of embodiments herein may exhibit bistable magnetic states at room temperature.

In some embodiments, a fixed skyrmion is reversed purely with an electrical field and without needing a spin current or a magnetic field. Devices and methods disclosed herein which employ fixed/stationary skyrmions have several advantages. One advantage is that they are more energy efficient than existing moving skyrmion based computing devices since it is unnecessary to have an electric current. Furthermore, if a current is used, the current can be greatly reduced in magnitude while still providing the desired effect. Another advantage is that the density of memory or computing units based on fixed skyrmions is substantially larger (at least 10 times more) than those based on moving skyrmions. Yet another advantage is that fixed skyrmion devices can be readout by vertically integrating a magnetic tunnel junction (MTJ) on it. This is amenable to building dense logic circuits with interconnects.

The MTJ structure 100 is able to distinguish between four different states, including two skyrmion states and two ferromagnetic states. The four states may be referred to as core-up skyrmion, core-down skyrmion, up-ferromagnetic (i.e., ferromagnetic up), and down-ferromagnetic (i.e., ferromagnetic down). MTJ structure 100 has a low on-off ratio between the two skyrmion states but can distinguish between the states.

FIG. 1B shows a two-terminal MTJ structure 160. Reading and writing are both performed via an annular electrode 166 thus enabling readout of the skyrmion periphery only. The annular electrode 166 has a hole in the center. For instance, the hole may be 2 nm in diameter. The annular electrode may be, for example, a circular ring or elliptical ring or polygonal ring (e.g., polygon with any shape hole in the center). The top electrode 166 excludes any portion which would cover or align vertically with a skyrmion core. The MTJ structure 160 provides high on-off ratio ((between the two skyrmion states or between the ferromagnetic "up" and ferromagnetic "down" states) but may not significantly distinguish between the skyrmion with peripheral magnetization pointing up and ferromagnetic state with magnetization pointing up. Likewise, it cannot significantly distinguish between the skyrmion with peripheral magnetization pointing down and ferromagnetic state with magnetization pointing down. Accordingly, the MTJ structure 160 may, in some embodiments, be treated as a two state memory element despite a physical capability of assuming four different states.

MTJ structures for embodiments of the invention, whether based on FIG. 1A, 1B, or some combination or variation of these, may take a number of alternative specifications such as with respect to dimensions and materials. An exemplary but non-limiting example of the lateral dimension of a device such as structure 100 or 160 is approximately 2 nanometers to 300 nanometers. Furthermore, in some embodiments, layers may be of equal size in some dimensions (e.g., diameter) and/or of identical shape (e.g., circular, etc.). Alternatively, different layers may have different dimensions and/or different shapes compared to one another. For instance, the fixed/hard layer of a MTJ structure may be smaller (e.g., smaller diameter) than the free layer. Either or both the fixed and free layers may be circular, elliptical, or polygonal in shape. An exemplary but non-limiting example of the thickness of the oxide layer 104 is about 1 nm. An exemplary but non-limiting range of thickness for the oxide layer 104 is approximately a fraction of a nanometer to a few nanometers (e.g., 3 or 4 nanometers). The oxide layer may be configured for pure VCMA switching, described below, or it may be configured for hybrid VCMA+STT switching, for example. Such configurations may involve setting or providing the oxide layer with a thickness that limits or prevents spin current, as in pure VCMA embodiments, or permits spin current, as in hybrid VCMA+STT embodiments.

Figure 2A:
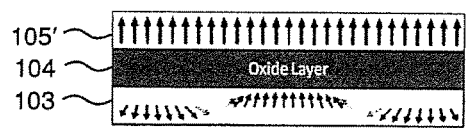
FIG. 2A is a schematic of a MTJ with a ferromagnetic fixed layer.
Figure 2B:
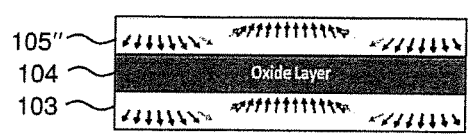
FIG. 2B is a schematic of a MTJ with a skyrmionic fixed layer.

FIGS. 2A and 2B show alternative configurations of a fixed layer of a MTJ structure. Fixed layer 105' (FIG. 2A) is a ferromagnetic fixed layer, and fixed layer 105" (FIG. 2B) is a skyrmionic fixed layer. Fixed layers 105' and 105" are both useable as fixed layer 105 in the MTJ structures 100 and 160 of FIGS. 1A and 1B. For context, FIGS. 2A and 2B show the oxide layer 104 and the free layer 103. The free layer 103 as illustrated is shown with a core-up skyrmion state which is one of the four possible states of the free layer 103.

Since some spins orient "up" and some "down" in a skyrmion, it may appear that it cannot be read with a ferromagnetic fixed layer. However, the core of a skyrmion (say "up" or predominantly "up" spins) and the periphery of the skyrmion (say "down" or predominantly "down" spins) may not equally divide the total skyrmion area, meaning there may be a disproportionate number of "up" spins or "down" spins overall. For instance, in a sample embodiment at a certain instance when a skyrmion state is stable, the core may be roughly 25% of the skyrmion area while the periphery is roughly 75% of the skyrmion area. Accordingly, the spin of the periphery would dominate overall. Hence, changing the core from "up" to "down" and correspondingly the periphery from "down" to "up" will change the magnetoresistance, and this change can be read out. Furthermore, one can increase the magnetoresistance by having a skyrmionic fixed layer so that each spin in the skyrmion in the free layer is exactly parallel or antiparallel to the corresponding spin in the skyrmionic fixed layer, thus maximizing the magnetoresistance ratio. The use of an annular read electrode that is only above the skyrmion periphery and not the skyrmion core (as in FIG. 1B) is another option utilized in some embodiments to maximize the magnetoresistance ratio for read out.

Figure 3:
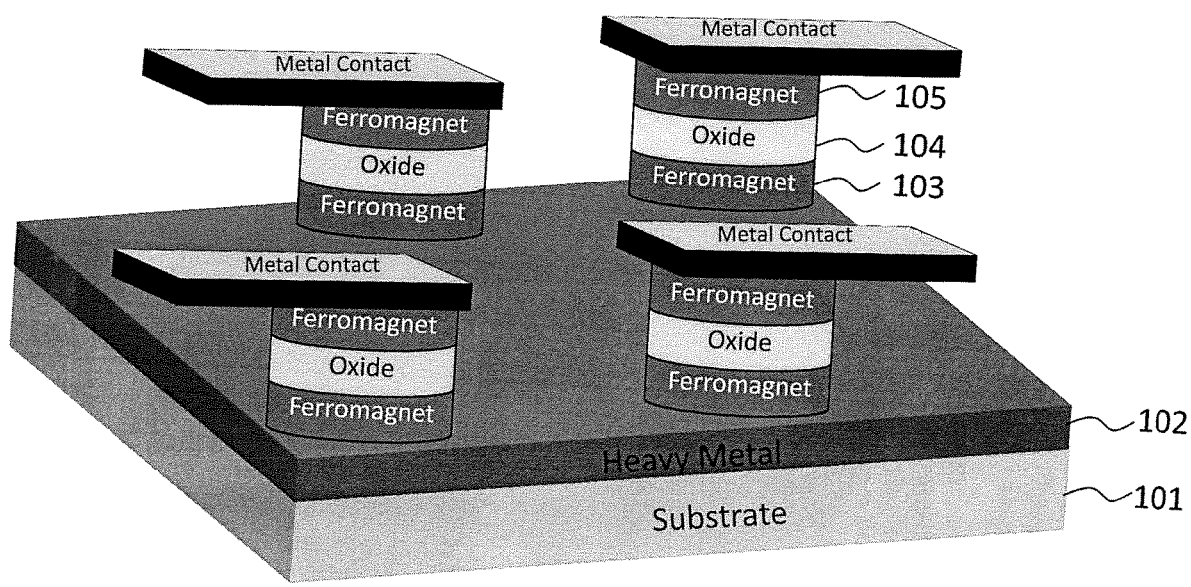
FIG. 3 is a schematic diagram of an array of MTJ structures.

FIG. 3 is a schematic diagram showing an array of MTJ structures. In practice, each MTJ structure belongs to a single memory cell of a non-transient memory storage medium containing vast numbers of MTJ structures like MTJ structure 100 or 160 (see FIGS. 1A, 1B).

Figure 4A:
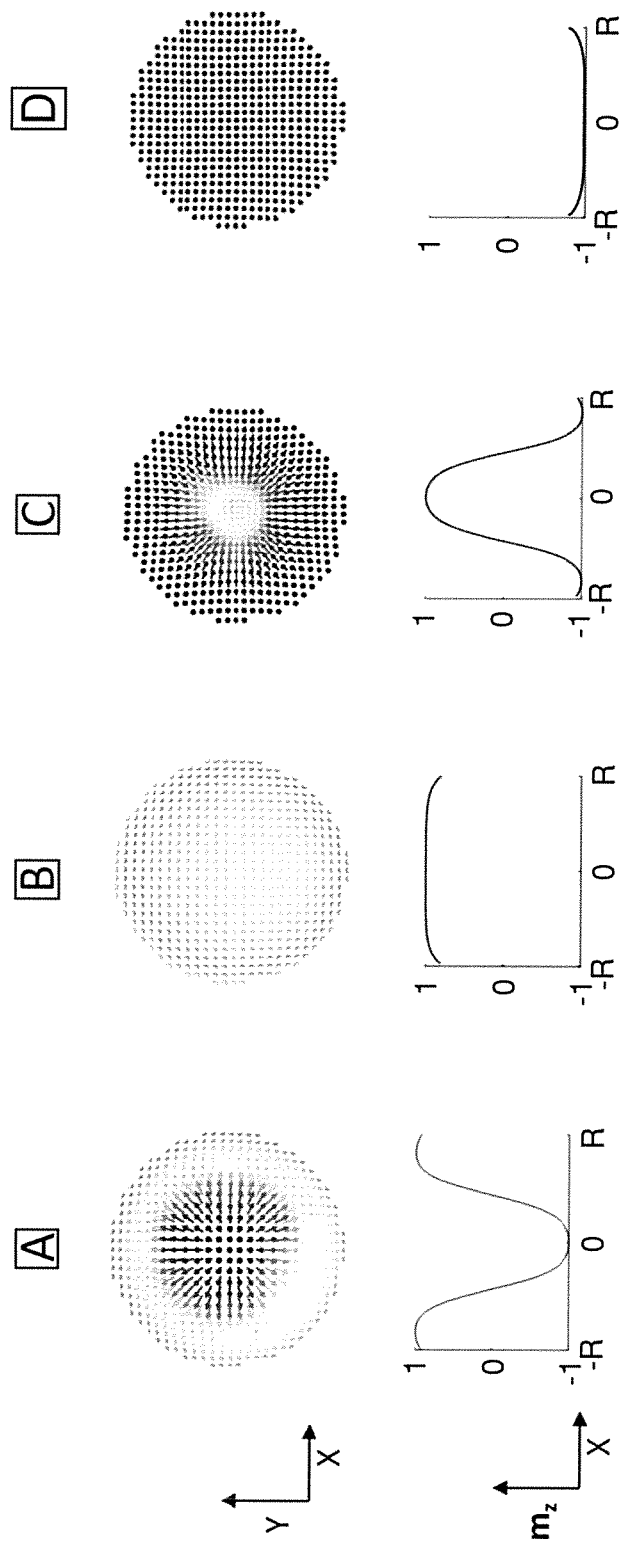
FIG. 4A shows four alternative magnetic states of a free layer of an MTJ structure.
Figure 4B:
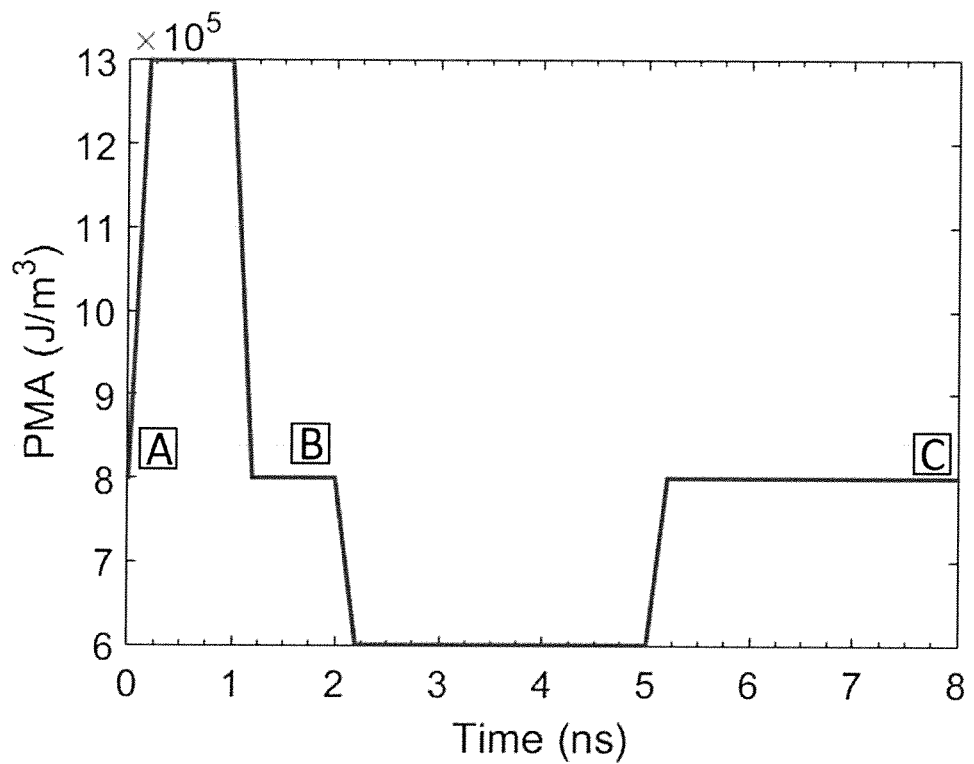
FIG. 4B shows an example PMA profile while switching between three of the states illustrated in FIG. 4A.

FIG. 4A shows, in the top row, four alternative magnetic states of a free layer of a MTJ structure which may be stable states in various embodiments. Some embodiments have two stable states (e.g., two opposite ferromagnetic states, or two opposite skyrmion states). Other embodiments have all four illustrates states (state-A, -B, -C, and -D) as stable states. Stable may mean, for example, thermally stable and/or stable in the presence of small magnetic fields. The bottom row of FIG. 4A shows the normalized perpendicular magnetization ($m_z$) in the z-direction as a function of position along the diameter of the free layer. The boundary limits are defined by the radius, R, of the circular/cylindrical geometry of the free layer. Column A shows a skyrmionic core-down state. Column B shows a ferromagnetic up state. Column C shows a skyrmionic core-up state. Column D shows a ferromagnetic down state. FIG. 4B shows an example PMA profile while switching between three of the states illustrated in FIG. 4A. The labels A, B, and C in FIG. 4B show the times at which states A, B, and C in FIG. 4A are respectively present in the free layer of the MTJ.

Figure 4C:
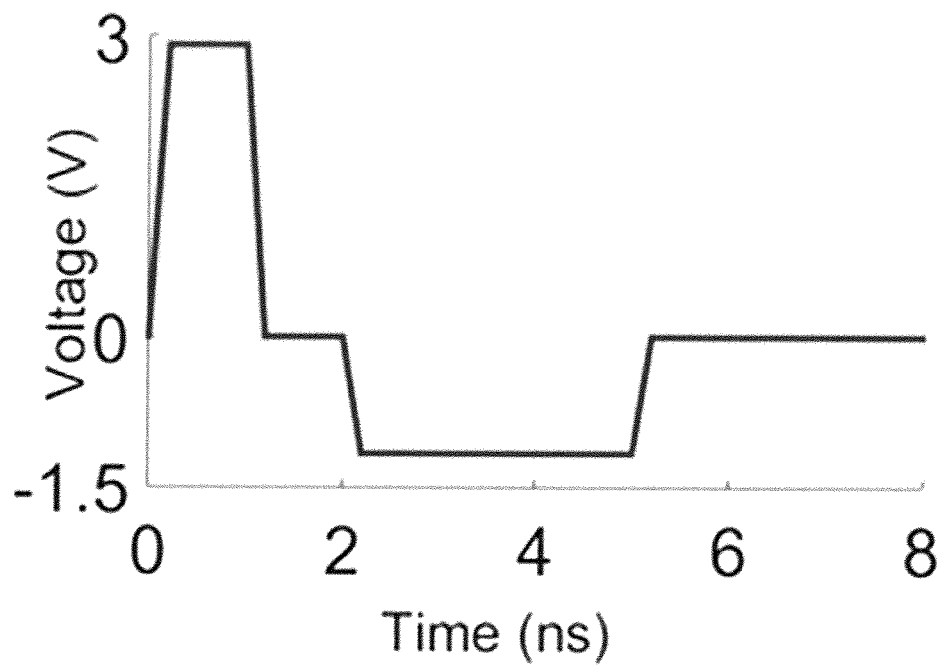
FIG. 4C shows an example voltage profile used to produce the PMA profile of FIG. 4B.

FIG. 4C shows an example voltage profile used to produce the PMA profile of FIG. 4B. As FIGS. 4A and 4B show, the states shown in FIG. 4A are stable states. They persist in an absence of an applied voltage.

Figure 5A:
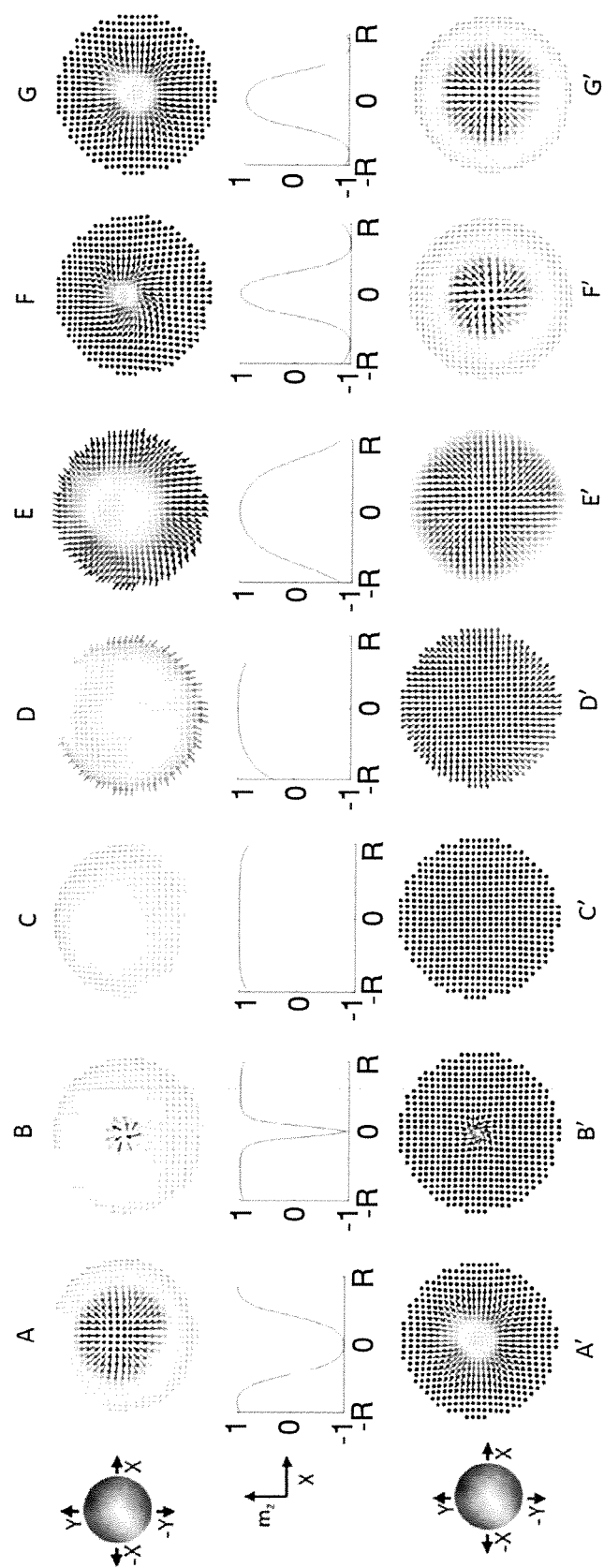
FIG. 5A shows an example of magnetic states of a free layer of an MTJ at different times during core reversal.

Switching with Pure VCMA—Two/Four-State Memory Employing a Bipolar Voltage Waveform FIG. 5A shows skyrmion core reversal by voltage control of magnetic anisotropy (VCMA) mediated by a ferromagnetic state. Pure VCMA switching may also be characterized as pure electric field switching. The application of a voltage waveform (e.g., a pulse) across the electrodes at either end of a memory element creates an electric field there between which affects the PMA. FIG. 5A also shows ferromagnetic core reversal by VCMA mediated by a skyrmionic state. Perpendicular anisotropy present at a oxide layer/free layer interface is sensitive to the electron density. Application of an electric field (via a voltage differential across top and bottom electrodes) modulates the electron density and consequently the perpendicular magnetic anisotropy (PMA) in the interface.

Figure 5B:
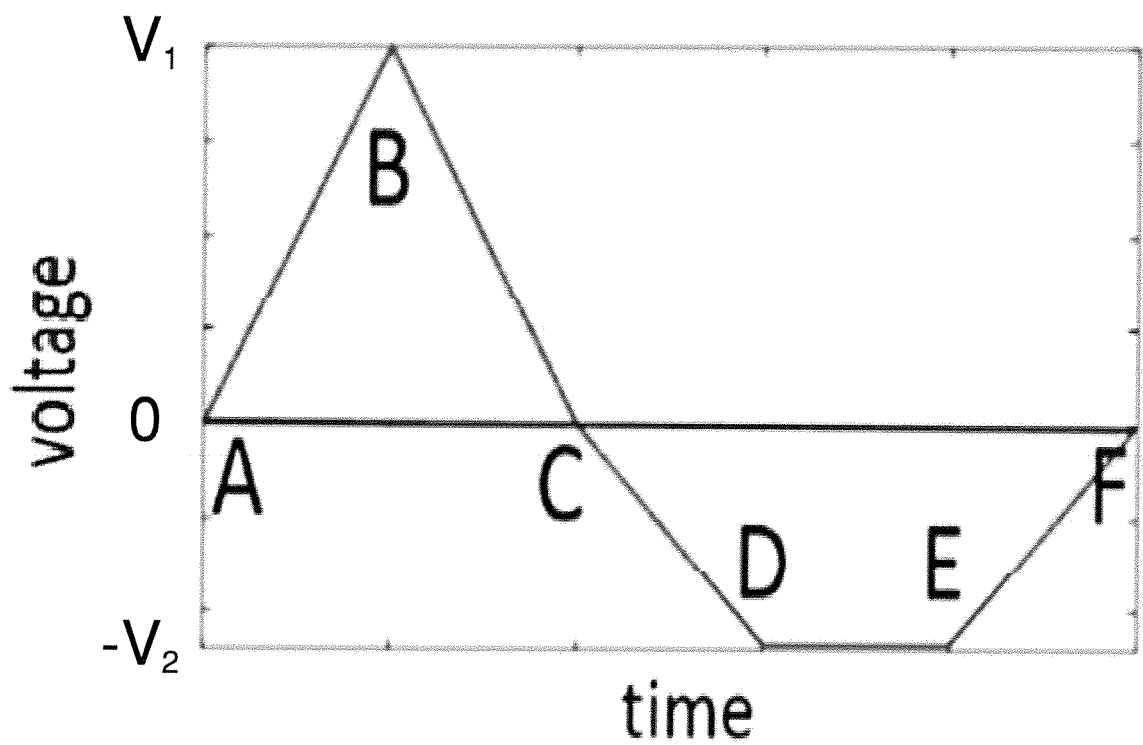
FIG. 5B shows a bipolar voltage profile corresponding with the events in FIG. 5A.
Figure 5C:
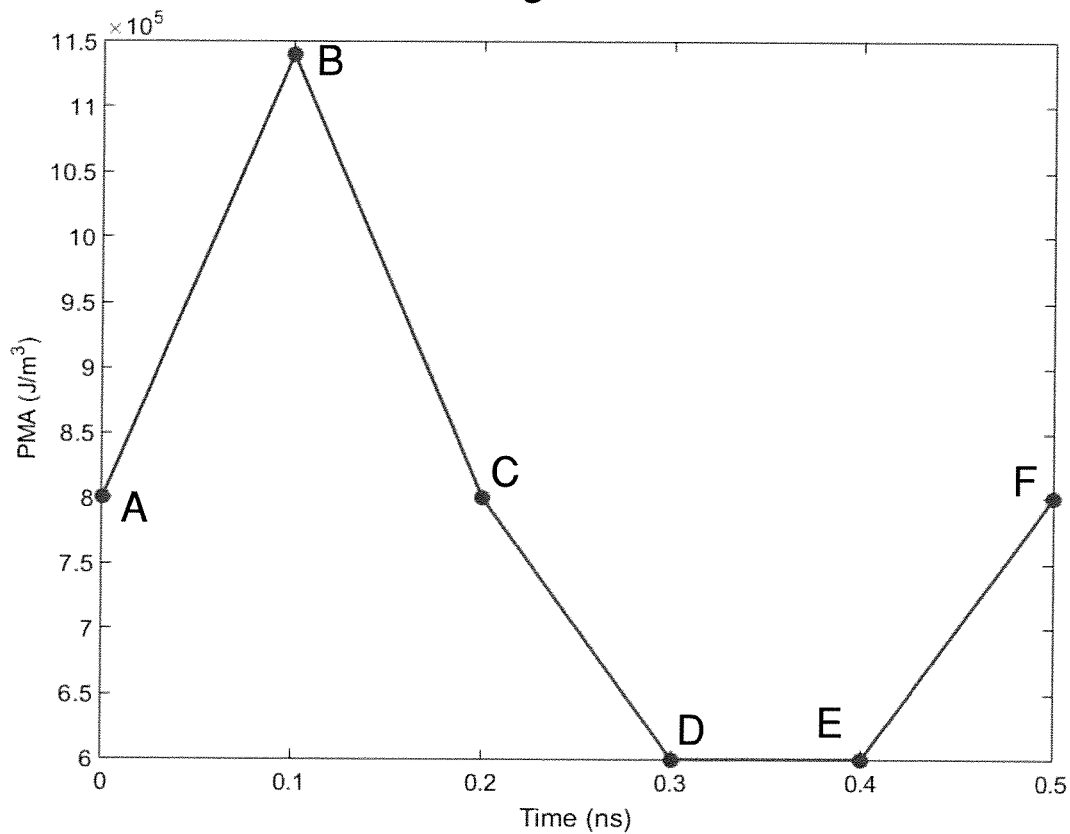
FIG. 5C shows the PMA profile corresponding with FIG. 5B. The voltage profile of FIG. 5B sequentially increases and then decreases the perpendicular magnetic anisotropy (PMA) present at the oxide layer/free layer interface.
Figure 5D:
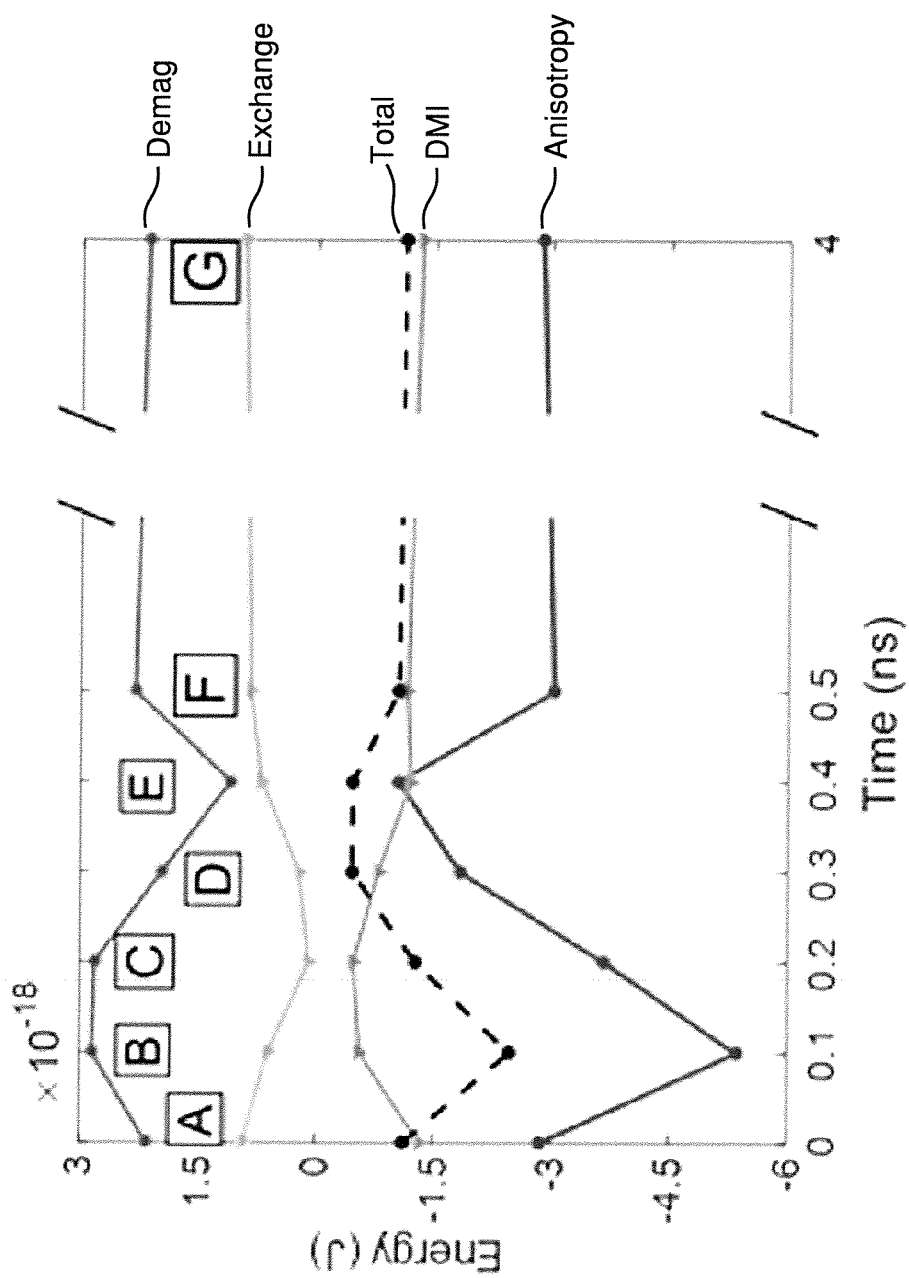
FIG. 5D shows energy properties of a prototype MTJ that adheres to the switching process illustrated by FIG. 5A.
Figure 5E:
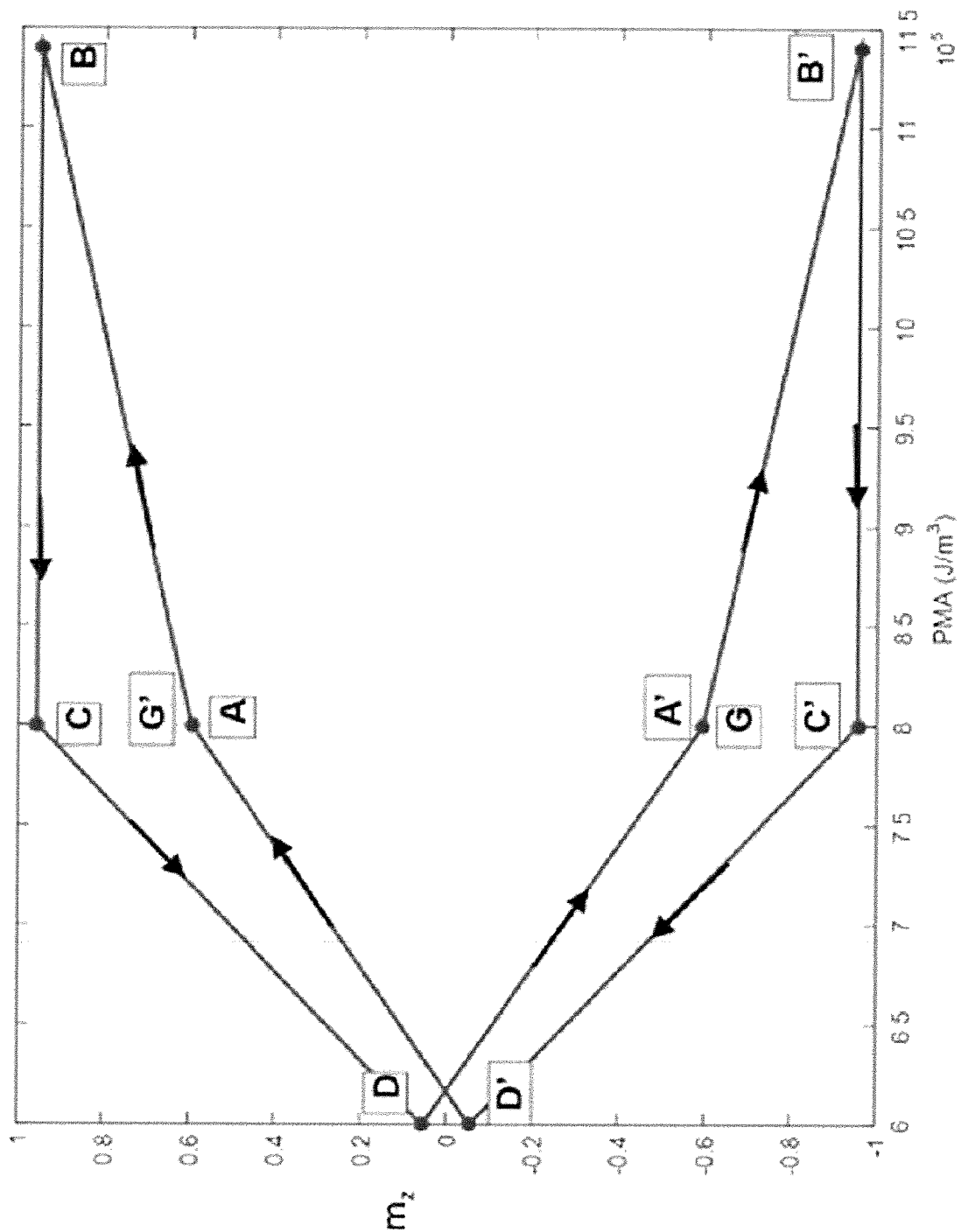
FIG. 5E shows normalized perpendicular magnetization ($m_z$) versus PMA for the magnetic states identified in FIG. 5A.

In FIG. 5A, each of the illustrations labeled A through G represent the magnetization of the free layer of a MTJ structure at a snapshot in time, where A has been chosen as a starting snapshot, G is a final snapshot, and the remaining letters are snapshots at equally spaced instances within the time interval between A and G. FIG. 5B shows a bipolar voltage pulse introduced by control circuitry across the MTJ structure having the free layer magnetization illustrated in FIG. 5A. The bipolar voltage pulse sequentially increases and then decreases the perpendicular magnetic anisotropy (PMA) present at the oxide/ferromagnet interface (the oxide layer to free layer interface) of the MTJ. These changes in PMA are illustrated in FIG. 5C, which shows anisotropy energy density as a function of time. Note that the alphabetical letter labeling (A through G) in FIGS. 5A, 5B, and 5C are intended to correspond across the four figures to show the concurrent magnetic state, applied voltage, and PMA at given instances in time. FIG. 5D shows energy properties of an exemplary prototype discussed in Example 1 below. FIG. 5E also uses the same alphabetic letter labeling to refer to the magnetic states illustrated in FIG. 5A.

According to the illustrative example provided by FIGS. 5A, 5B, and 5C the bipolar voltage pulse includes a triangular-shaped pulse of a first polarity (duration A to C) followed by a plateau- or trapezoidal-shaped pulse of an opposite polarity (duration C to F). During the first pulse that occurs from time A to time C, sufficient increment of PMA annihilates the skyrmion (FIG. 5A, state-A) and therefore a ferromagnetic state is stabilized (FIG. 5A, state-C). This ferromagnetic state remains stable even after the voltage pulse is withdrawn (note the 0 voltage at time C in FIG. 5A). Next, the voltage pulse of opposite polarity is applied from time C to time F. This pulse reduces the PMA and consequently drives the magnetic state of the free layer to a skyrmionic state (FIG. 5A, state-G). Although initial state-A and final state-G are both skyrmionic states, they have the opposite polarity. Specifically, state-A is core-down and state-G is core-up. Hence, a two state memory device can be implemented utilizing this switching behavior. FIG. 5A also shows the same switching process excepting starting from an initial state-A' which is core-up and ending with a final state-G' which is core-down. Because the ferromagnetic states (state-C which is ferromagnetic up and state-C' which is ferromagnetic down) are also stable states, a four state memory device is implemented simply by splitting the bipolar pulse illustrated in FIG. 5B into two separate unipolar pulses of opposite polarity (the difference being a waiting interval inserted at point C on the graph). Overall device structures such as are shown in FIG. 1A are used to readout all four states. The device structure shown in FIG. 1B is used to distinguish between two states, making structure 160 well suited specifically for two state memory. The structure 160 does not distinguish between a core-up skyrmion (i.e., a periphery-down skyrmion) state and a ferromagnetic down state. Similarly, structure 160 does not distinguish between a core-down skyrmion (i.e., a periphery-up skyrmion) state and a ferromagnetic up state. The energy cost in this switching process illustrated by FIGS. 5A, 5B, and 5C can be as low as 100 aJ.

Figure 6:
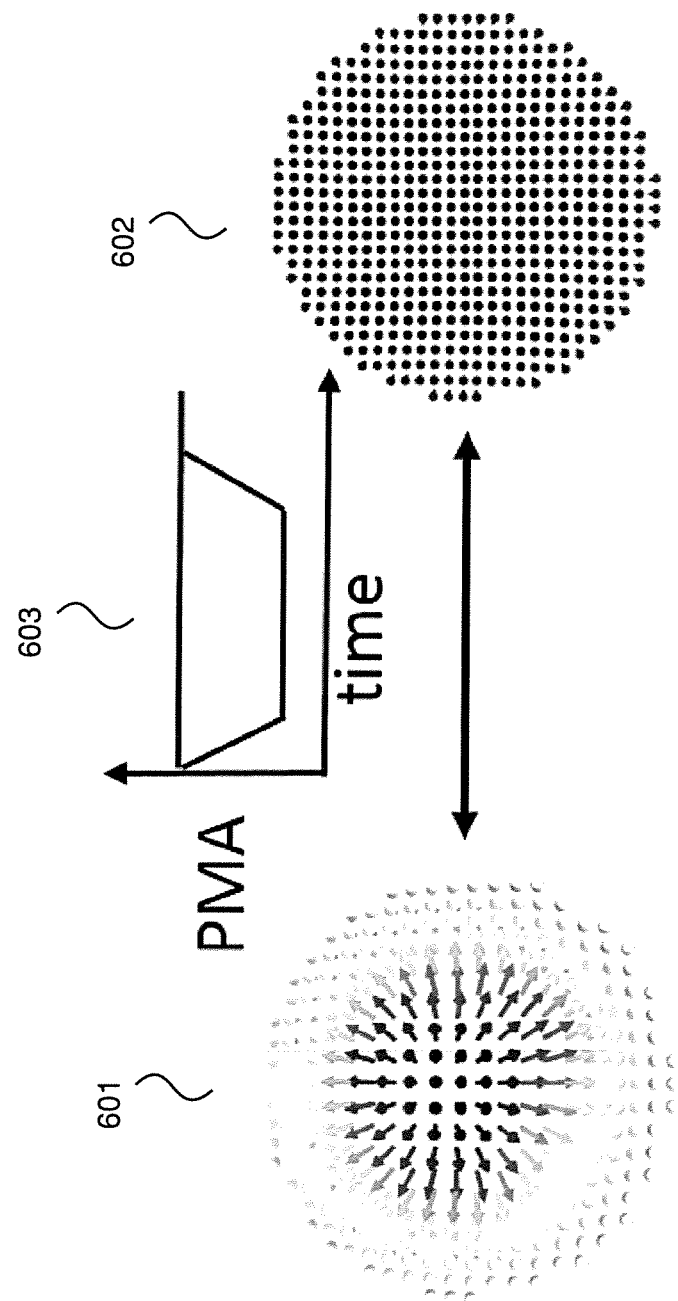
FIG. 6 shows a transformation between a skyrmionic and a ferromagnetic state using a unipolar pulse that reduces anisotropy.

A voltage waveform has the effect of charging the spacer layer (e.g., the MgO layer) between the fixed and free layers. It should be appreciated that throughout this disclosure, voltage "pulse" is used an exemplary waveform, but embodiments of the invention need not be limited to voltage pulses in all cases. Therefore, a unipolar voltage pulse may be substituted with an alternative unipolar voltage waveform. Similarly, a bipolar voltage pulse may be substituted with an alternative bipolar voltage waveform. An exemplary voltage pulse is trapezoidal shaped with a dwell time between the rise and fall. While square pulses are theoretically possible, square pulses are in practice still trapezoidal since truly instantaneous changes in voltage do not occur. With a trapezoidal shaped voltage pulse, the total pulse time may be 100 ps, for example. Faster pulses are also useable. An alternative to a trapezoidal shaped voltage pulse is a triangular voltage pulse, which has no appreciable dwell time between the rise and fall. Using the bipolar pulse illustrated in FIG. 5B, a skyrmion-ferromagnetic transition may be as fast as 0.2 ns. In effect, it is permissible to remove the electric field immediately once it reaches peak value. Another alternative to the bipolar pulse in FIG. 5B is a symmetrical trapezoidal shaped positive pulse together with the trapezoidal shaped negative pulse or both triangular pulses. Such alternatives do not affect the switching physics.
Switching with Pure VCMA—Two-State Memory Employing a Unipolar Voltage Pulse In some embodiments, some (but not necessarily all) aspects of the switching behavior described above in connection with FIG. 5A—are used to provide two state memory devices where magnetization is completely reversed employing only a unipolar pulse instead of employing a bipolar waveform as in FIG. 5A. FIG. 6 shows a transformation between a skyrmionic state 601 and a ferromagnetic state 602 using a unipolar pulse 603 that reduces anisotropy. Reducing anisotropy increases the core size of the skyrmion. A ferromagnetic state with the polarity of the skyrmion core is stabilized after the restoration of PMA. This ferromagnetic state can be reversed to the previous skyrmionic state by reduction of anisotropy via applying another voltage pulse.

Figure 7A:
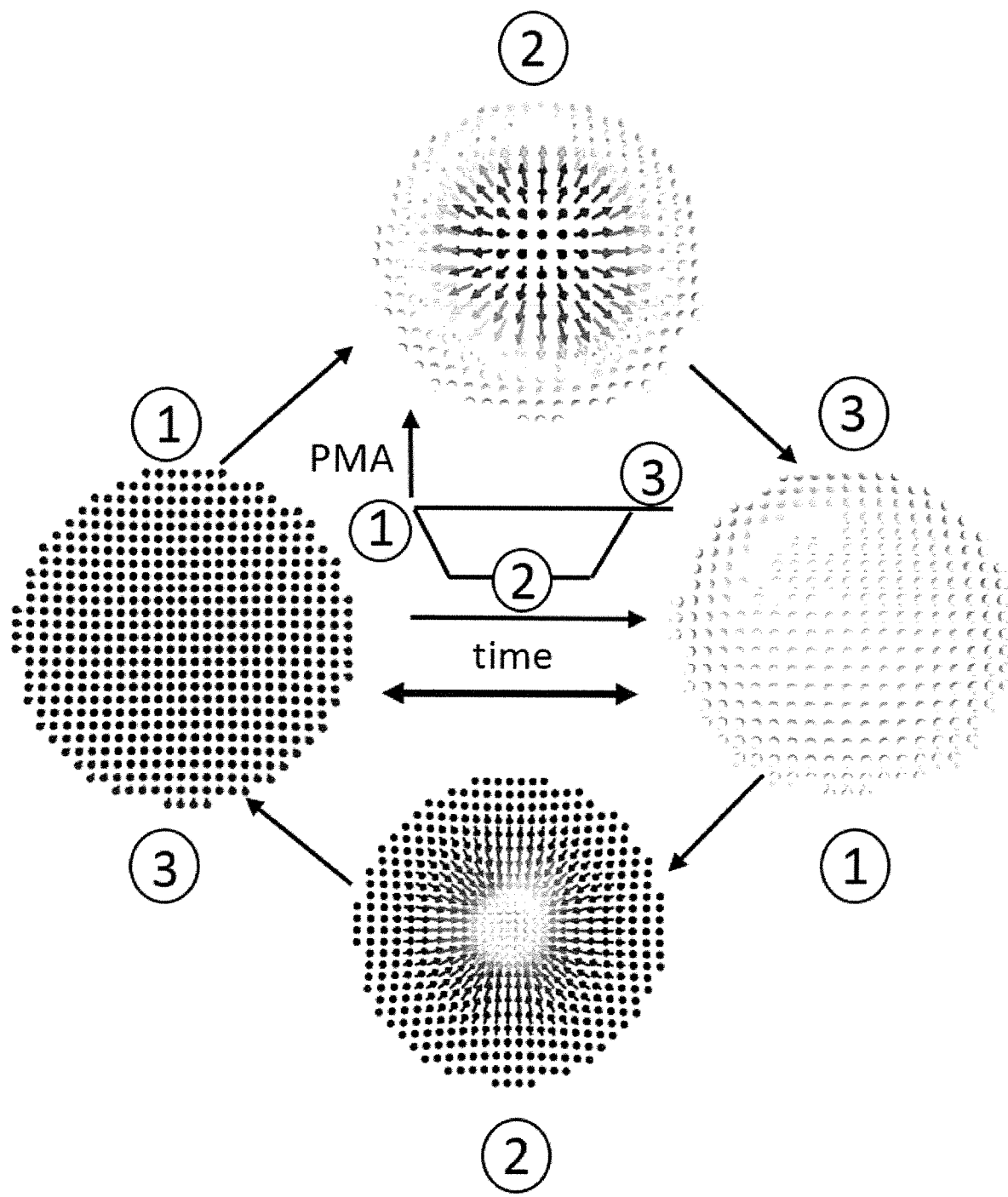
FIG. 7A shows a reversal of magnetic states using a unipolar pulse, where the reversal is between two ferromagnetic states via an intermediate skyrmionic state.

FIG. 7A shows a reversal between two ferromagnetic states via an intermediate skyrmionic state. The free layer of the MTJ structure starts with either ferromagnetic state (state-1, either ferromagnetic-up or ferromagnetic-down) as a stable state. A voltage pulse is applied that reduces PMA and accomplishes the switching. With the application of the voltage pulse, the ferromagnetic state gradually turns into a skyrmionic state (state-2) due to the reduction of anisotropy. When the voltage pulse is removed, the PMA is restored and the skyrmionic state (state-2) is annihilated. The free layer assumes a stable state that is a ferromagnetic state (state-3) which has the opposite polarity of the initial ferromagnetic state (state-1).

Figure 7B:
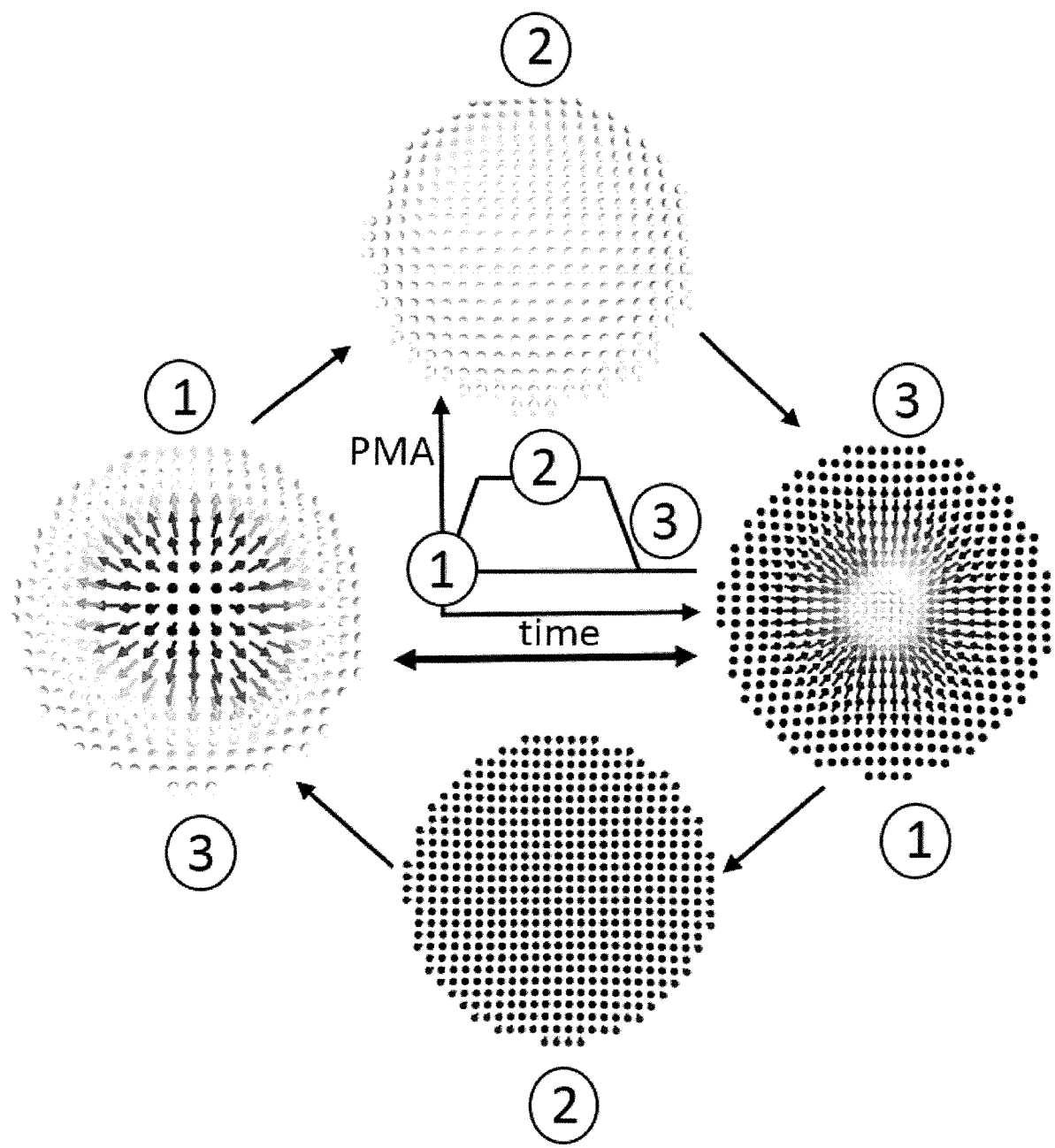
FIG. 7B shows a reversal of magnetic states using a unipolar pulse, where the reversal is between two skyrmionic states via an intermediate ferromagnetic state.

Complete reversal of skyrmions can be achieved in a similar fashion by applying a voltage pulse that increases PMA instead of applying a voltage pulse that decreases PMA. FIG. 7B shows this alternative single pulse switching process.

FIG. 7B shows reversal between two skyrmionic states via an intermediate ferromagnetic state. The free layer begins with an initial skyrmionic state (state-1, either core-up or core-down). A voltage pulse is applied which increases the PMA. The skyrmionic state is annihilated when PMA is sufficiently increased, giving an intermediate ferromagnetic state (state-2). A reversed skyrmionic state (state-3) stabilizes during the restoration of an original PMA level as the applied voltage is removed. The final skyrmionic state (state-3) has the opposite polarity of the initial skyrmionic state (state-1).

For FIGS. 7A and 7B, a device structure such as shown FIG. 1A can be used for reading out the two states. FIGS. 7A and 7B both illustrate only the free layer, leaving out illustration of the fixed layer. A ferromagnetic fixed layer will be most advantageous while switching between two ferromagnetic states (as in FIG. 7A), because the ferromagnetic fixed layer provides the highest magnetoresistance change in these circumstances. Similarly, a skyrmionic fixed layer will be most advantageous while switching between two skyrmionic states (as in FIG. 7B), because the skyrmionic fixed layer provides the highest magnetoresistance change in these alternative circumstances.

Hybrid Switching with VCMA and STT

Most exemplary embodiments described above provide switching of memory elements purely with VCMA, in an absence of an external/bias magnetic field or an applied current that provides spin transfer torque (STT). As an alternative, further exemplary embodiments provide a hybrid scheme that uses both VMCA and STT. Skyrmion reversal is achieved using STT, but this is coupled with application of a voltage per VMCA. Application of a small voltage to a MTJ structure reduces the threshold current needed for reversal of skyrmions. Reduction in PMA lowers the barrier that exists between two skyrmionic states, and therefore the required current density for reversal is also reduced.

FIG. 1A shows a simplified magnetic tunnel junction (MTJ) structure suitable for implementation of a VCMA/STT hybrid scheme for switching a magnetic skyrmion (free layer of the MTJ). A ferromagnetic fixed layer (e.g., a perpendicularly magnetized ferromagnet) or a skyrmionic fixed layer may be used. One common pair of electrodes may be used for application of both VCMA and spin current. Similar to the pure VCMA embodiments per the discussion above, hybrid VCMA+STT embodiments may have the same overall structure (e.g., FIG. 1A as depicted remains relevant) and in some but not necessarily all embodiments the same materials for reach respective layer. In contrast to exemplary pure VCMA embodiments described above, however, at least the stress state of the materials are configured differently to produce a bipolar effect instead of a unipolar VMCA effect. In an exemplary MTJ structure configured for a hybrid switching process that combines VCMA and STT, the MTJ structure has a $\wedge$-shaped electric field dependence of magnetic anisotropy. The $\wedge$-shaped electric field dependence may be provided by configuring the MTJ structure to include an epitaxial strain, among alternative options. For instance, a Heavy Metal/Ferromagnet/Insulator trilayer can have epitaxial strain, which gives rise to a $\wedge$-shaped electric field dependence of magnetic anisotropy. As a result, application of a voltage regardless of the polarity will reduce the PMA. However, the direction of the spin current will depend on the polarity of the applied voltage. Skyrmions can be reversed with a spin current when $\vec{m}_p \cdot \vec{m}_c = 1$, where $\vec{m}_p$ is the polarity of spin current and $\vec{m}_c$ is the polarity of the skyrmion core. This is very convenient since the polarity of the applied voltage may be changed depending on the required direction of the spin polarized current for reversal, and nevertheless PMA reduction is achieved due to VCMA. Therefore, using a fixed layer with magnetization pointing up, a skyrmion with core pointing up is reversible by applying a positive voltage. Similarly, using a fixed layer with magnetization pointing down, a skyrmion with core pointing up is reversible by applying a negative voltage. Hence, this basic MTJ structure is sufficient to carry out the exemplary switching scheme provided that an epitaxial strain and therefore a $\wedge$-shaped electric field dependence of magnetic anisotropy is present in the structure. This is well suited to typical magnetic memory applications since this the structure is similar to existing spin transfer torque (STT) RAM and only requires appropriate design of the oxide layer thickness and addition of a heavy metal layer between the free layer and the substrate. Generally, the oxide layer (e.g., layer 104 in FIGS. 1A and 1B) is thinner for hybrid switching embodiments than for pure VCMA switching embodiments. Applying a voltage across a very thin oxide layer not only affects VCMA but also drives a spin polarized current through the MTJ.

Since the periphery (with spins pointing up/down) has much larger area than the core with spins pointing down/up, reversing the skyrmion will change the magnetoresistance of the ferromagnet (hard layer)/tunnel barrier/skyrmion (soft later) MTJ structure appreciably, thereby allowing the skyrmion state to be read easily. Vice versa is also possible.

Figure 8:
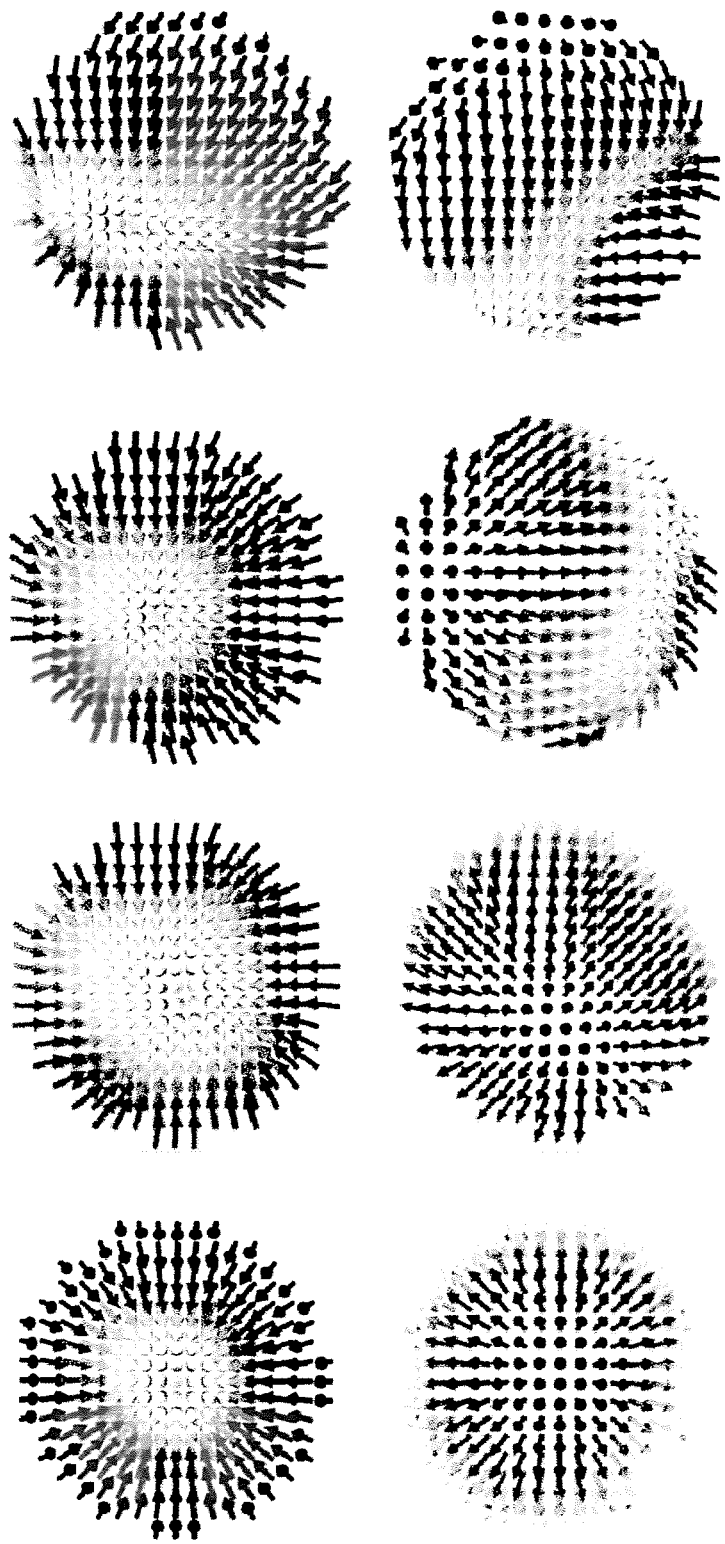
FIG. 8 shows an example of switching a skyrmion state using a hybrid scheme of VCMA with STT using a skyrmionic fixed layer.
Figure 13:
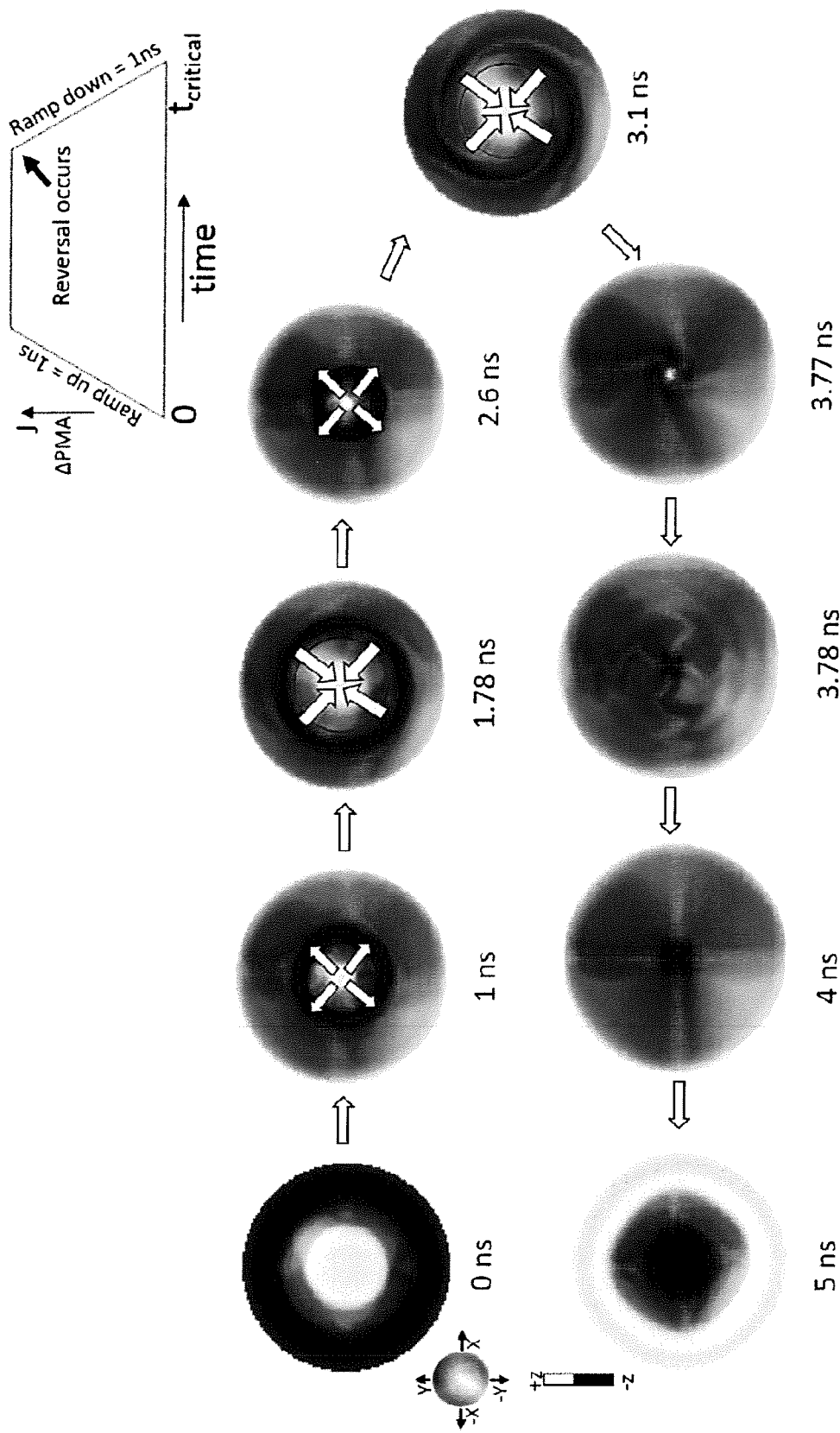
FIG. 13 shows an example of snapshots of magnetization dynamics during a hybrid switching process using VCMA and STT together with a ferromagnetic fixed layer, where the change in PMA is large.

FIG. 8 shows switching a (free layer) skyrmion using a hybrid scheme of VCMA with STT where the fixed layer is a skyrmion. FIG. 13, in contrast, shows switching a (free layer) skyrmion using a hybrid VCMA+STT scheme where the fixed layer is a ferromagnetic layer. FIG. 13 is described in greater detail below in connection with Example 2.

The use of VCMA in conjunction with spin current to switch fixed skyrmion based memory devices results in an order of magnitude smaller energy dissipation (e.g., the required write energy) compared to switching conventional STT devices or voltage assisted reversal of ferromagnets. Furthermore, hybrid VCMA+STT switching can be faster than ferromagnetic switching. Moreover, an exemplary device structure for performing the hybrid switching process can be fabricated with very small modification to the existing manufacturing process for spin transfer torque (STT) RAM devices. In short, exemplary devices according to this aspect of the invention may be regarded as energy efficient non-volatile nanomagnetic memory devices based on existing spin transfer torque (STT) writing schemes and technology.

Boolean and Non-Boolean Logic Elements

According to further aspects of some embodiments, Boolean logic (e.g., a universal logic gate) and non-Boolean computing devices (e.g., neuromorphic devices) are provided which implement switching processes described above.

Some embodiments involve a NAND gate that uses a magnetic tunnel junction consisting of skyrmionic free and fixed layers. The gate may operate using a hybrid scheme, where spin transfer torques generated from input voltages switch the core magnetization of the free layer skyrmion in conjunction with a clock source. As one option, a voltage induced strain may act as the clock. This may involve using a piezoelectric thin film placed below the heavy metal layer. In this case, strain alone should not be able to perform the switching, but merely provide the "clock" reducing the spin current needed for the switching. Another option is to use direct voltage control of magnetism through VCMA to avoid the need for incorporating a piezoelectric material in the manufacturing process.

For a NAND gate, the logic levels "1" and "0" are represented by the two voltage levels $V_{high}$ and $V_{low}$. The two inputs terminals V1 and V2 are such that the skyrmion core can only be reversed when both of them are high (so that sufficient spin current or VCMA is generated). Table 1 below is a truth table for this configuration:

TABLE 1

Truth table for NAND gate.

| V1 | V2 | Output |
|---|---|---|
| $V_{low}$ | $V_{low}$ | $R_{high}$ |
| $V_{low}$ | $V_{high}$ | $R_{high}$ |
| $V_{high}$ | $V_{low}$ | $R_{high}$ |
| $V_{high}$ | $V_{high}$ | $R_{low}$ |

The MTJ starts from a high resistance state. The fixed layer skyrmion has a downward pointing core and the free layer skyrmion core is oriented upward by the reset operation. The MTJ can be put in this state independent of V1 and V2 by applying a reset voltage $V_{reset}$. The resulting current will switch the soft layer skyrmion core magnetization upward due to spin torque from the spins reflected by the hard layer and reset the device before every logic operation. When both or either input voltages are low, the resulting spin current is not high enough to reverse the core. As a result, the MTJ remains in the high resistance state. When both of the input voltages are high and a clock is applied, the free layer core reverses and points downward, making it parallel to fixed layer. This puts the MTJ in a low resistance state.

A NOR gate may also be implemented by making the threshold to switching smaller than for the NAND gate. The two inputs terminals V1 and V2 are such that the skyrmion core can be reversed when either one of them is high (so that sufficient spin current or VCMA is generated). Table 2 below is a truth table for this configuration:

TABLE 2

Truth table for NOR gate.

| V1 | V2 | Output |
|---|---|---|
| $V_{low}$ | $V_{low}$ | $R_{high}$ |
| $V_{low}$ | $V_{high}$ | $R_{low}$ |
| $V_{high}$ | $V_{low}$ | $R_{low}$ |
| $V_{high}$ | $V_{high}$ | $R_{low}$ |

Figure 9:
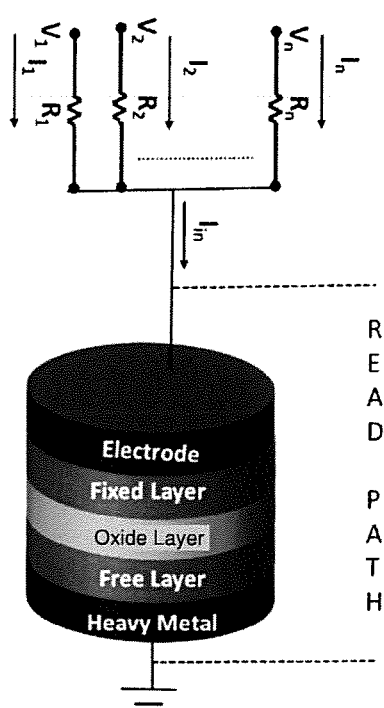
FIG. 9 shows a non-Boolean logic device, in particular an example of a spin neuron, that utilizes skyrmion reversal.

FIG. 9 shows a non-Boolean logic device, in particular a spin neuron, that utilizes skyrmion reversal. In a conventional 'spin-neuron', magnetization of the free layer of a MTJ is switched between ferromagnetic up or down states to mimic neuron firing. Threshold behavior of neuron firing depends on a weighted sum of input currents that delivers a spin transfer torque (STT) required for reversal or weighted sum of voltages that produce a strain to rotate the magnetization. A novel variant of spin-neuron is provided in some embodiments wherein magnetization of the free layer of the MTJ is switched between core-up and core-down skyrmionic states.

Figure 10:
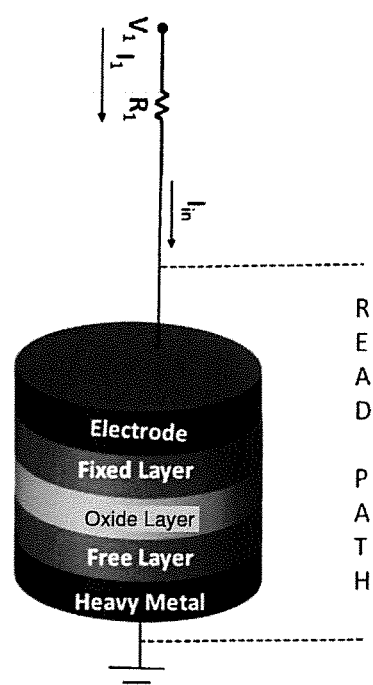
FIG. 10 shows a non-Boolean logic device, in particular an example of a synaptic memory, that utilizes skyrmion reversal.

FIG. 10 shows a non-Boolean logic device, in particular a synaptic memory, that utilizes skyrmion reversal. In biological systems, synapses may undergo temporary strengthening (short-term plasticity) or permanent strengthening (long-term potentiation), based on the input frequency. Magnetization dynamics in an MTJ can closely resemble this behavior, i.e., magnetization orientation reverses when frequency of the input signal is in the correct range or "band". Synaptic behavior is replicated in some exemplary embodiments herein via skyrmion reversal in the free layer of an MTJ. A current/voltage pulse will alter the core size, and therefore the magnetoresistance will change for a short period of time. However, an appropriate frequency current/voltage pulse-train will reverse the core and change the magnetoresistance permanently which enables long-term potentiation behavior. Additionally, the skyrmion core expansion/contraction has to be phased appropriately with the input pulses, which may also provide useful knobs to control synaptic behavior.

Example 1. Voltage Controlled Core Reversed of Fixed Magnetic Skyrmion without a Magnetic Field and without Moving Skyrmions with a Current This example simulated the magnetization dynamics in a perpendicular anisotropy CoFeB/MgO/CoFeB MTJ structure to demonstrate skyrmion core reversal. Typical parameters for the CoFeB layer are listed in Table 3.

TABLE 3

Parameters of $Co_{20}Fe_{60}B_{20}$.

| Parameter | Value |
| --- | --- |
| saturation magnetization ($M_s$) | $1 \times 10^6$ A/m |
| exchange constant (A) | $2 \times 10^{-11}$ J/m |
| perpendicular anisotropy constant ($K_u$) | $8 \times 10^5$ J/m$^3$ |
| Gilbert Damping | 0.03 |
| DMI parameter | 3 mJ/m$^2$ |

Note that the parameters in Table 3 were used merely for illustrative purposes in this Example, and embodiments in the practice of the invention may use a variety of materials with properties differing from Table 3. Altering material parameters within acceptable limits will not change the underlying physics of the switching mechanism, although the exact switching details may change some with different material parameters.

Simulations were performed using a micromagnetic simulation application named Mumax. The geometry was discretized into 1×1×1 nm$^3$ cells. The change in uniaxial anisotropy constant is realized by modulating the electric field. In the Mumax framework, the magnetization dynamics is simulated using the Landau-Lifshitz-Gilbert (LLG) equation:

$$\frac{\partial \vec{m}}{\partial t} = \vec{\tau} = \left(\frac{-\gamma}{1+\alpha^2}\right)\left(\vec{m} \times \vec{H}_{eff} + \alpha(\vec{m} \times (\vec{m} \times \vec{H}_{eff}))\right)$$

where $\vec{m}$ is the reduced magnetization ($\vec{M}/M_s$), $M_s$ is the saturation magnetization, $\gamma$ is the gyromagnetic ratio, and $\alpha$ is the Gilbert damping coefficient. The quantity $\vec{H}_{eff}$ is the effective magnetic field which is given by, $$\vec{H}_{eff} = \vec{H}_{demag} + \vec{H}_{exchange} + \vec{H}_{anisotropy}$$

where, $\vec{H}_{demag}$, $\vec{H}_{exchange}$, and $\vec{H}_{anisotropy}$ are respectively the effective field due to demagnetization energy, the effective field due to Heisenberg exchange coupling and DMI interaction, and the effective field due to the perpendicular anisotropy.

The MTJ structure was configured according to FIG. 1A. The bottom CoFeB layer is the free layer which was chosen to be a nanodisk with diameter of 80 nm and thickness of 1 nm. The reversal of the skyrmionic state is achieved through modulation of the perpendicular magnetic anisotropy by applying an electrical voltage. Modulation of the PMA initiates a change in the orientation of the spins and ultimately the equilibrium spin configuration is achieved by minimizing the total energy of the system which includes exchange energy, DMI energy, magnetic anisotropy energy and demagnetization energy. The micromagnetic simulation of Example 1 describes the evolution of the magnetic configuration with time to reach this local minimum. The reversal is a two-step process. The voltage profile and anisotropy energy density change with time. The magnetic energies of the system at various states and configurations of different magnetic states visited during the switching process are shown in FIGS. 5A-5D.

The example started with a skyrmion whose core points down (FIG. 5A, state A). In the first step, a positive voltage is applied to the skyrmion which strengthens the perpendicular anisotropy. This forces more spins to point in the direction perpendicular to the x-y plane (i.e., in the direction ±z) to reduce the anisotropy energy. Minimization of curvature energy cost of the circular domain wall (i.e., the spin spiral) demands stabilization of a skyrmion with smaller core radius when PMA is increased.

As a result, the diameter of the skyrmion core keeps reducing with increasing PMA (FIG. 5A, state B). This makes +z direction the preferred direction among the two possible perpendicular spin orientations (±z). Allowing the spins to relax under this condition would transform the magnetization to a complete ferromagnetic state. However, once a sufficient number of spins are pointing in the downward (-z) direction (very small core diameter as can be seen in FIG. 5A, state B), exchange interaction is able to drive the rest of the core spins downward and thus a ferromagnetic state is achieved while reducing the applied voltage to zero (FIG. 5A, state C). Increase in the DMI and demagnetization energy due to this transformation (from state A to state C) is compensated by the reduction in anisotropy and exchange energy as shown in FIG. 5E. This ferromagnetic state (state C) is also stable (similar to the skyrmionic state A) and this is what makes it non-volatile. Note that, spins at the edge of a skyrmion confined in a nanodisk tilt so that they have a magnetization component along the x-y plane. This can be seen by observing magnetization component in the z-direction of different points along the diameter in FIG. 5A. Therefore, the geometric edge may enable continuous annihilation.

In the next step, a negative voltage is applied to lower the perpendicular anisotropy. When the perpendicular anisotropy is made sufficiently low by applying a large enough negative voltage, the DMI and demagnetization energies become dominant. The spins then rearrange themselves in this altered energy landscape and transforms from the complete ferromagnetic state to an incomplete skyrmion state as shown in FIG. 5A, state D. In this state, the spins in the core point up (+z) and the spins in the periphery are tilted downward (-z). Under these conditions, the spins finally stabilizes as shown in FIG. 5A, state E, forming an incomplete skyrmion with skyrmion number between 0.5 and 1. The tilting starts at the periphery of the disk because this results in a smaller penalty in terms of exchange energy than the tilting of the spins in the core. Finally, the applied voltage is removed and the zero bias PMA is restored. The spins in the periphery of the nanodisk now rotate completely to the -z direction and the spins in the core retain their upward (+z) magnetization direction. As a result, a skyrmion state with core pointing up is formed as shown in FIG. 5A, state F. The skyrmion formed in state F is not at equilibrium but can reach equilibrium without any external bias after some time as shown in FIG. 5A, state G. This is also non-volatile. Hence, there is a bistable skyrmionic state "0" and "1". A similar voltage pulse can be applied immediately to the skyrmion in state F to switch to the initial magnetic state. Transition from state A to state F takes 0.5 ns in this Example. This switching speed allows for a memory device with a speed of 2 GHz.

FIG. 5D shows energies of the different magnetic states at corresponding discrete point in time during this example which follows the switching process of FIGS. 5A-5C. FIG. 5D also uses the same alphabetic letter labeling to refer to the magnetic states illustrated in FIG. 5A. The topmost line, with points primarily in the range of (1.5 to 3)×10$^{-18}$ J shows demagnetization energy. The second line from the top of the graph, with points falling in the range of (0 to 1.5)×10$^{-18}$ J, shows exchange energy. The solid line with points falling in the range of (−1.5 to 0)×10⁻¹⁸ J shows DMI energy. The bottommost line shows anisotropy energy. Finally, the broken line with points falling in the range of (−3 to 0)×10⁻¹⁸ J shows total energy. For all five energy profiles, connecting lines between any two points are for ease of visualization and do not represent actual energies as a function of time between these points.

Each equilibrium configuration (states A, C, and G) was attained by forming a magnetic configuration that corresponds to a local energy minimum closest to its prior state, i.e. the state from which this system evolves, and separated from other local minima by an energy barrier. Thus, when the system evolves from a state stabilized by high PMA due to VCMA with a positive voltage, it settles to the ferromagnetic state when the VCMA is reduced to zero. But, when the system evolves from a state stabilized by low PMA due to VCMA with a negative voltage, it settles to the skyrmion state when the VCMA is reduced to zero. But it cannot spontaneously switch between the skyrmion and ferromagnetic state due to the energy barrier separating them.

Switching of a skyrmion with upward core spins and downward periphery spins to a skyrmion with downward core spins and upward periphery spins can be achieved by applying the same voltage pulse as shown FIG. 5B. The transition through the various magnetic states (from A' to G') during this switching process is shown in the bottom row of FIG. 5A. We note that this electrically controlled skyrmion core reversal is deterministic. With a sufficiently long positive (or negative) voltage pulse, skyrmion-ferromagnetic (or ferromagnetic-skyrmion) transition probability does not rely on precise pulse withdrawal as these states are stable and separated by an energy barrier. Consequently, reversible switching between all four states (two skyrmion and two ferromagnetic) is possible as can be seen in FIG. 5E. The ability to toggle between the alternative states makes this device a viable memory element.

In summary of the Example, the Example demonstrates the use of voltage controlled magnetic anisotropy for core reversal of a magnetic skyrmion, skyrmion mediated ferromagnetic state reversal, and switching between skyrmionic states and ferromagnetic states without requiring any bias magnetic field. By integrating an MTJ, reading capability of the different magnetic states can be achieved in the manner of FIG. 1A. The additional reading/writing mechanisms introduced by FIG. 1B may be used in alternative embodiments.

The energy dissipated in switching between the skyrmions states is estimated as follows: the modulation of the interface anisotropy energy is given by $J_{sa}=J_0+aE$, where a, E and $J_0$ are respectively the coefficient of electric field control of magnetic anisotropy, the applied electric field, and the interface anisotropy energy at zero bias field. Now, coefficient of electric field control of magnetic anisotropy is defined as $$a = \frac{\Delta k \times t_{CoFeB}}{\Delta V / t_{MgO}}$$

where $\Delta k$ is the change in anisotropy energy density, $\Delta V$ is the applied voltage, $t_{CoFeB}$ and $t_{MgO}$ are the respective thickness of CoFeB and MgO layer. Reported value of "a" is ≈100 μJ/m² per V/nm with appropriate iridium buffer. Thus, with a 1 nm thick free layer and 1 nm thick MgO layer, 1×10⁵ J/m³ change in the anisotropy energy density can be obtained per volt.

Note that a thinner fixed layer would provide large PMA and ensure the magnetization of this fixed layer is not affected by the voltage applied. The fixed layer is configurable to be thinner to have much higher PMA which ensures a minimal effect of changing PMA. In other words the PMA in this fixed layer is configurable to be strong so that any voltage induced change of magnetic anisotropy will not perturb the magnetization direction of this fixed layer. Additionally, the fixed layer is configurable so that the coefficient of electric field control of magnetic anisotropy in the fixed layer is low. For example, one such method is to omit/exclude a Hafnium monolayer between the MgO and the fixed layer, making the coefficient of electric field control of magnetic anisotropy smaller in the fixed layer. Furthermore, some embodiments may include a synthetic antiferromagnetic (SAF) layer to increase magnetic stability of the fixed layer, and electric field induced magnetization rotation in the fixed layer will be further minimized. Hence, Example 1 ignores anti-symmetric modification effects. The synthetic antiferromagnetic (SAF) layer offsets the dipolar interaction between the fixed and the free layer. Hence, Example 1 also ignores dipolar effects.

The required maximum and minimum PMA can achieved by applying electrical voltages of $V_1=3.4V$ and $V_2=-2V$, respectively, for the device configuration (e.g., of FIG. 1A). These values translate into an energy dissipation of ≈2.4 fJ per switching cycle at a switching speed of 2 GHz if all the energy required to charge the capacitive MgO layer (relative permittivity ≈7, thickness ≈1 nm, diameter ≈80 nm) is ultimately dissipated. Insertion of a Hafnium (Hf) monolayer between the free layer and MgO layer can increase "a" by 5.2 times. Such optimization can reduce energy dissipation to only ≈90 aJ which is five times less than the energy dissipated to switch a conventional CMOS device of comparable speed. The diameter of the nanodisk forming the free layer can be scaled down as small as 40 nm to further reduce the energy dissipation. Furthermore, an advantage of the nanomagnetic element is its non-volatility. Moreover, substantial reduction of energy dissipation may be achieved by lowering the electric field needed for the switching process if the coefficient of anisotropy energy change (a) is enhanced in future materials/interfaces. Moreover, the device is triggerable to switch between states in a few nanoseconds, a duration that is competitive for computing applications, particularly given low energy dissipation and non-volatility.

A positive (negative) electric field will increase (decrease) the exchange stiffness which will enable easy transformation from skyrmion to ferromagnetic (or ferromagnetic to skyrmion) state which can be understood from the energy profile plotted in FIG. 5E. Simulated scenarios considering electric field induced modification of exchange stiffness show that switching occurs at lower electric field. Hence, the voltage estimates presented in this example are conservative.

These results show the viability of switching fixed skyrmions with voltage controlled magnetic anisotropy, novel interfaces with higher coefficient of anisotropy energy change (a), energy efficient memory devices based on skyrmion core reversal or ferromagnetic state reversal (via an intermediate skyrmion state), and Boolean and non-Boolean MTJ based computing.

Example 2. Fixed Skyrmion Reversal with Spin Current Assisted by VCMA

This Example examines the viability and investigates the physics of reversal of the magnetic state of a fixed skyrmion using a hybrid scheme of VCMA and STT. The presence of DMI in a skyrmion system distinguishes this hybrid technique from those performed on uniformly magnetized ferromagnetic systems.

Micromagnetic simulation software-OOMMF was used to perform simulations where the magnetization dynamics is simulated using the Landau-Lifshitz-Gilbert (LLG) equation:

$$\frac{\partial \vec{m}}{\partial t} = \vec{\tau} = \left(\frac{-\gamma}{1+\alpha^2}\right)(\vec{m} \times \vec{H}_{eff} + \alpha(\vec{m} \times (\vec{m} \times \vec{H}_{eff})))$$

where $\vec{m}$ is the reduced magnetization ($\vec{M}/M_s$), $M_s$ is the saturation magnetization, $\gamma$ is the gyromagnetic ratio, and $\alpha$ is the Gilbert damping coefficient. The quantity $\vec{H}_{eff}$ is the effective magnetic field which is given by, $$\vec{H}_{eff} = \vec{H}_{demag} + \vec{H}_{exchange} + \vec{H}_{anisotropy}$$

where, $\vec{H}_{demag}$, $\vec{H}_{exchange}$, and $\vec{H}_{anisotropy}$ are respectively the effective field due to demagnetization energy, the effective field due to Heisenberg exchange coupling and DMI interaction, and the effective field due to the perpendicular anisotropy.

The DMI contribution to the effective exchange field is given by:

$$H_{DM} = \frac{2D}{\mu_o M_s}\left[(\vec{\nabla}, \vec{m})\hat{z} - \vec{\nabla}m_z\right]$$

where $m_z$ is the z-component of magnetization and D is the effective DMI constant.

$H_{anisotropy}$, the effective field due to the perpendicular anisotropy, is determined as follows:

$$\vec{H}_{ams} = \frac{2K_{u1}}{\mu_0 M_{sat}}(\vec{u}, \vec{m})\vec{u} + \frac{4K_{u2}}{\mu_0 M_{sat}}(\vec{u}, \vec{m})^3 \vec{u}$$

where $K_{u1}$ and $K_{u2}$ are first and second order uniaxial anisotropy constants and $\vec{u}$ is the unit vector in the direction of the anisotropy (i.e. perpendicular anisotropy in this case).

VCMA effectively modulates the anisotropy energy density, which is given by $\Delta PMA = aE$. Here a and E are respectively the coefficient of electric field control of magnetic anisotropy and the applied electric field. The resultant change in uniaxial anisotropy due to VCMA is incorporated by modulating $K_{u1}$ while keeping $K_{u2}=0$.

The torque due to spin current is given by, $$\tau_{STT} = \gamma\beta(\vec{m} \times (\vec{m} \times \vec{m}_p)),$$

$$\beta = \frac{h}{2\pi}\frac{PJ}{2\mu_0 eM_S L}$$

Here, $\vec{m}_p$ is the unit vector of spin polarization direction, h is Planck's constant, P is the degree of spin polarization, J is the current density, $\mu_0$ is vacuum permeability, e is the electron charge, and L is the thickness of the free layer. In this Example, current is assumed to be uniform along the diameter of the nanodisk. For the sake of simplicity, field like torque and Oersted field due to current flow is not included. However, as these terms are consistently not considered for all the cases simulated, the key conclusions of this example will not change significantly even if these terms are considered.

The free layer of an MTJ was chosen to be a nanodisk of 200 nm diameter and 1 nm thickness. The geometry was discretized into $2 \times 2 \times 1$ nm$^3$ cells. The simulation used material parameters of a simulated material for the free layer as listed in Table 4 below. Note that the parameters in Table 4 were used merely for illustrative purposes in this Example, and embodiments in the practice of the invention may use a variety of materials with properties differing from Table 4. Altering material parameters within acceptable limits will not change the underlying physics of the switching mechanism, although the exact switching details may change some with different material parameters. However, gain achieved due to VCMA assistance may slightly vary from this Example.

TABLE 4

Parameters used in simulations of Example 2.

| Parameter | Value |
| --- | --- |
| saturation magnetization ($M_s$) | $3 \times 10^5$ A/m |
| exchange constant (A) | $1 \times 10^{-11}$ J/m |
| perpendicular anisotropy constant ($K_u$) | 90 kJ/m$^3$ |
| Gilbert Damping ($\alpha$) | 0.02 |
| DMI parameter (D) | 1 mJ/m$^2$ |
| Degree of Spin Polarization (P) | 0.4 |

The simulations used a fixed ferromagnetic layer with magnetization pointing up. All simulations were carried out at T=0 K, i.e., effect of thermal noise on magnetization dynamics was not included in this example. For these material parameters, skyrmionic state emerges as a stable state.

Figure 11:
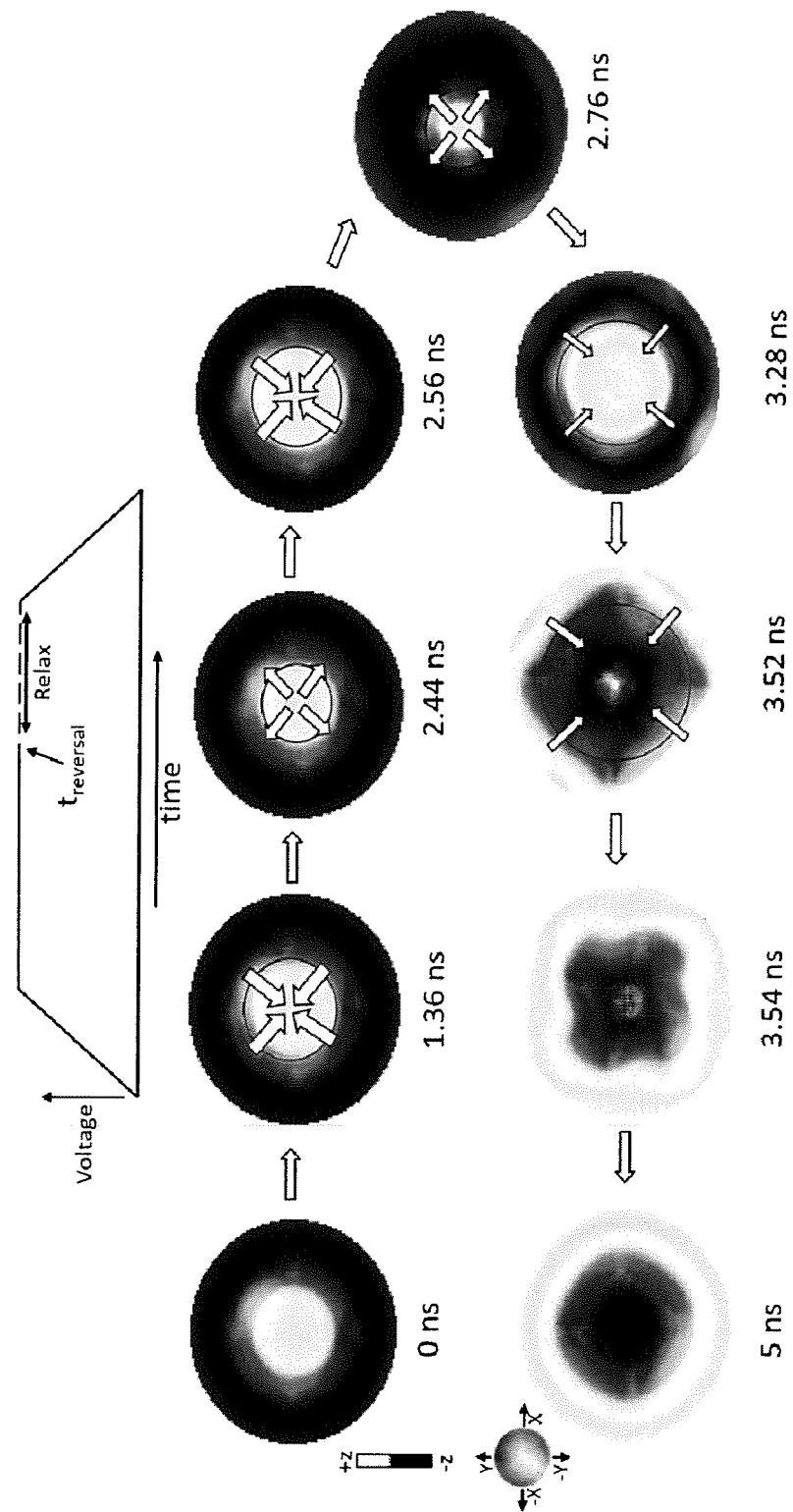
FIG. 11 shows an example of snapshots of magnetization dynamics during a switching process using only spin current with a ferromagnetic fixed layer.

FIG. 11 shows snapshots of magnetization dynamics during the simulated switching process using only spin current ($9.2 \times 10^{10}$) to produce the switch. The circle and the arrows show the expansion and shrinkage of skyrmion core during the switching. The voltage pulse that produces the spin current is shown at figure top. Note that this voltage pulse is not a VCMA voltage pulse in this particular figure. The rotational motion of domain wall spins is not shown for simplicity.

The simulation starts with a skyrmionic state with spins in the core pointing upwards and spins in the periphery pointing downwards. Because the fixed layer points upwards, a positive current is used to initiate reversal (since $\vec{m}_p \cdot \vec{m}_c = 1$). A current pulse of 1 ns rise and 1 ns fall time is injected. Then the critical switching current and time required for reversal are found. The spin current excites breathing mode of increasing amplitude. The skyrmion texture continually alters between Neel (radial outward and inward) and Bloch (counter clockwise and clockwise) states. These two motions are synchronized. Thus, the breathing mode stabilizes the Neel skyrmion texture at the largest and the smallest core size and Bloch texture in between these Neel states. Due to this spin wave excitation, the skyrmion core expands and shrinks, as shown in FIG. 11 (t=1.36 ns, 2.44 ns, 2.56 ns, 2.76 ns. 3.28 ns). At t=3.52 ns, the initial it rotation skyrmion turns into a $2\pi$ rotation skyrmion. Then, the inner core annihilates and core reversal is completed (t=3.54 ns). Once reversal occurs the torque induced by the spin current acts as a damping agent and a skyrmion with opposite core polarity is stabilized (t=5 ns). The critical switching current density is found to be $8.4\times10^{10}$ A/m$^2$, and the system takes 5.27 ns to complete the switching.

Figure 12:
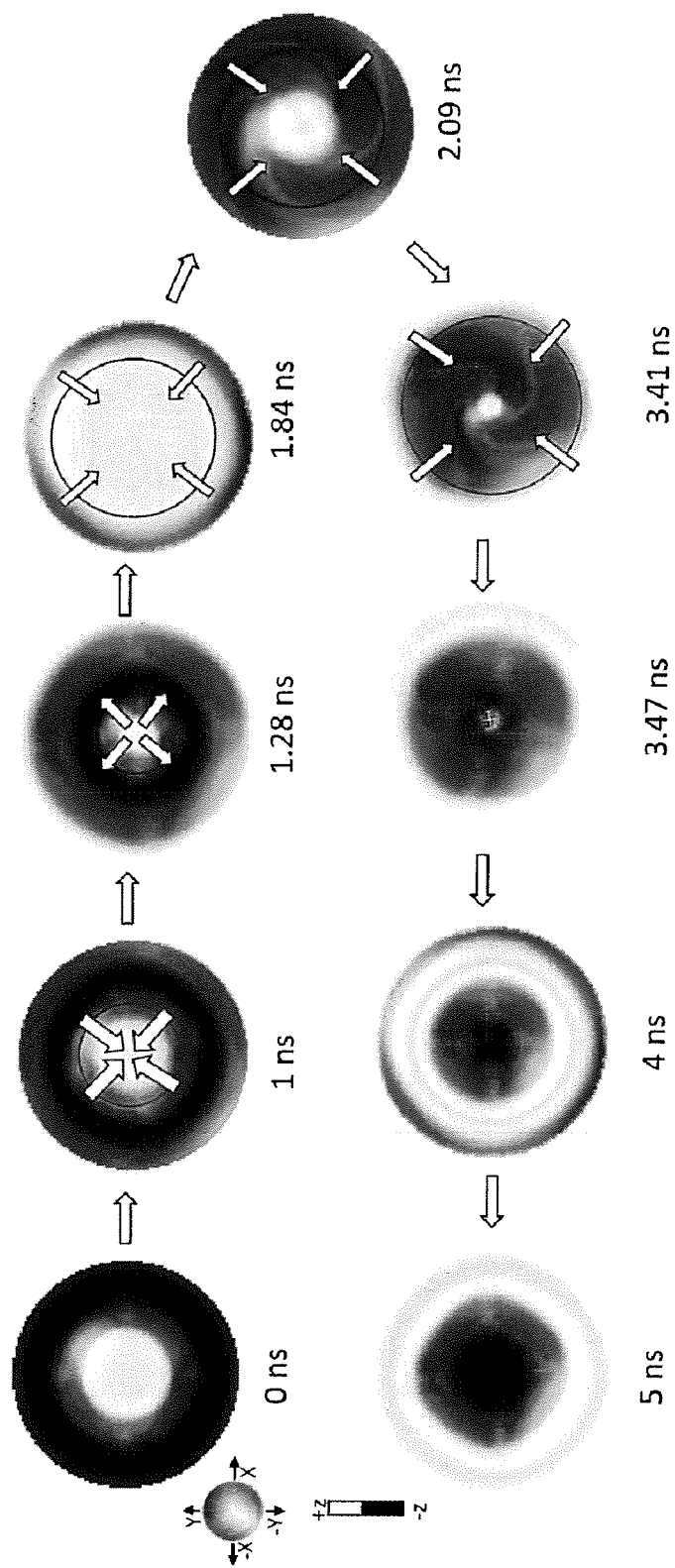
FIG. 12 shows an example of snapshots of magnetization dynamics during a hybrid switching process using VCMA and STT together with a ferromagnetic fixed layer, where the change in PMA is small.

FIGS. 12 and 13, in contrast to FIG. 11, show switching processes in which PMA is reduced using VCMA. These figures show the effect of reducing PMA on the switching behavior. Reduction in PMA creates an alternative path for reversal. This Example includes two cases, ΔPMA=45 kJ/m$^3$ (FIG. 12) and ΔPMA=90 kJ/m$^3$ (FIG. 13). The pulse characteristics for both simulations comprise a 1 ns rise and 1 ns fall time for both types of pulses (i.e., spin current pulse and voltage pulse for perpendicular anisotropy modulation).

FIG. 12 shows snapshots of magnetization dynamics during the switching process with spin current ($3\times10^{10}$) and small ΔPMA (45 kJ/m$^3$). The circle and the arrows show the expansion and shrinkage of skyrmion core during the switching. That FIG. 12 involves ΔPMA=45 kJ/m$^3$ means the minimum PMA is 90 kJ/m$^3$-45 kJ/m$^3$=45 kJ/m$^3$ during the switching process. From an appearance perspective, this switching resembles the case of FIG. 11 where only spin current was used to reverse the skyrmion. The reversal stabilizes a skyrmion with opposite polarity but with increased skyrmion number (close to 1.5) due to lower PMA (FIG. 12, t=4 ns). After restoring the PMA a skyrmionic state exactly opposite to the initial state stabilizes (FIG. 12, t=5 ns). Although the switching behavior is substantially the same between the process of FIG. 11 and the process of FIG. 12, the critical current density is reduced by ~4 times compared to the case where no VCMA is applied. The reduction in critical currently density means the total energy consumption of the memory element may be reduced. The switching time vs. current density is discussed later on below.

FIG. 13 shows a switching trajectory in which PMA is reduced further as compared to the switching trajectory in FIG. 12. FIG. 13 shows snapshots of magnetization dynamics during the switching process with spin current ($9\times10^9$) and large ΔPMA (90 kJ/m$^3$). The circle and the arrows show the expansion and shrinkage of the core during the switching. In FIG. 13, ΔPMA=90 kJ/m$^3$ so that the minimum PMA during switching is reduced to zero (90 kJ/m$^3$-90 kJ/m$^3$=0 kJ/m$^3$). At first, reduction in PMA pushes the peripheral spins to the x-y plane and outwards from the core (FIG. 13, t=1 ns). The core spins still point upwards, and the spin spiral attached to the core points inward. This can be characterized as a skyrmion with skyrmion number between 1.5 and 2. Ultimately, the spin wave excitation reverses the core. The core shrinking and expanding is shown by arrows in FIG. 13 (t=1-3.1 ns). This reversal also orients spin spiral attached to the core outwards. Therefore, a radial vortex state with core pointing downward is stabilized (FIG. 13, t=4 ns). After reversal, restoring PMA pushes the peripheral spin upwards and thus a skyrmion with polarity opposite to the polarity of the initial state is stabilized (FIG. 13, t=5 ns). Here, the critical current density is reduced by ~28 times compared to the case where no VCMA is applied (FIG. 11).

Figure 14:
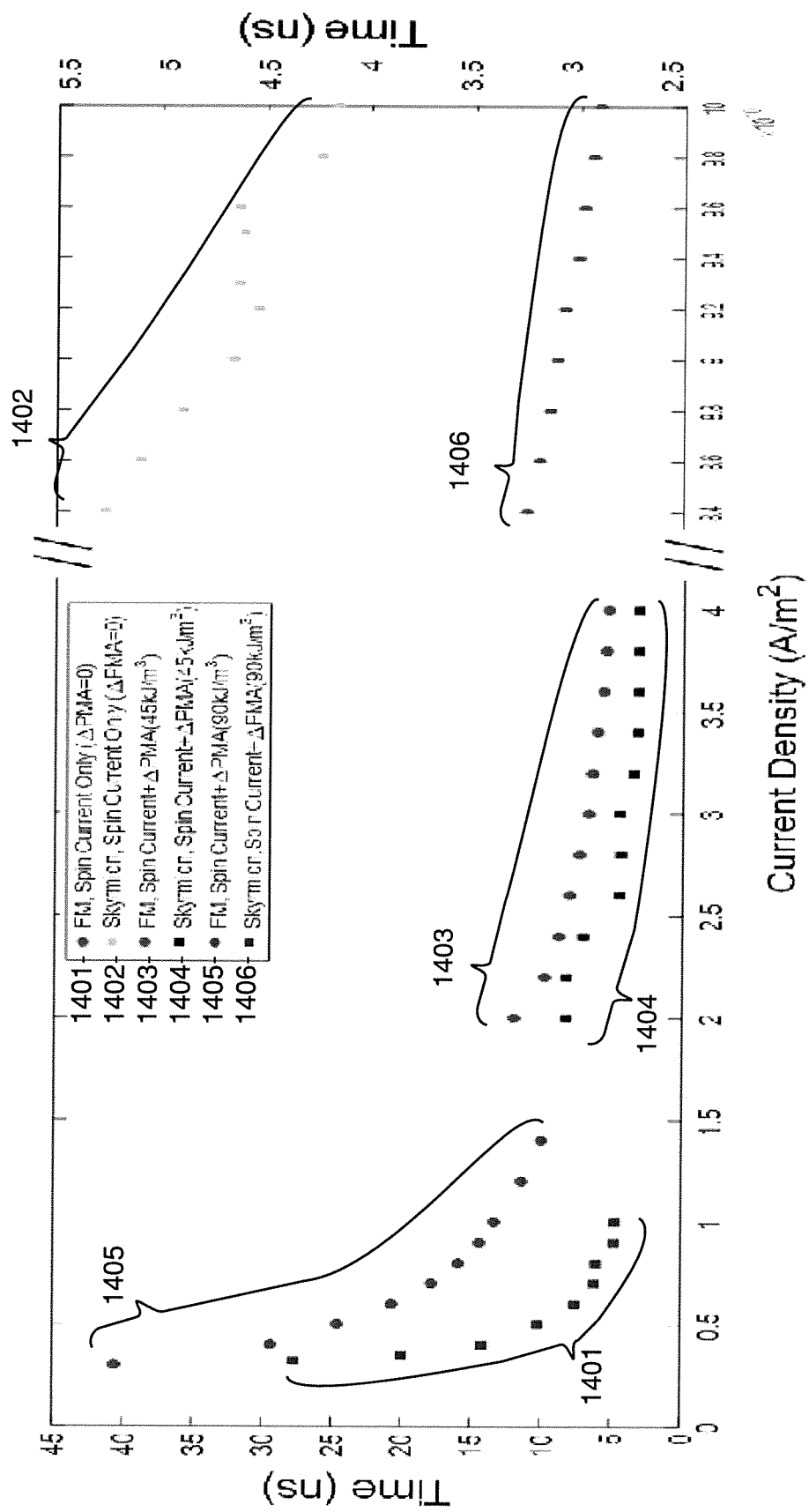
FIG. 14 shows an example of switching time vs current density for skyrmionic reversal and ferromagnetic reversal under hybrid VCMA+STT schemes.

FIG. 14 shows switching time vs. current density for the three cases discussed above in connection with FIGS. 11, 12, and 13. Points 1401 correspond with a ferromagnetic reversal using spin current only (ΔPMA=0). Points 1402 correspond with a skyrmion reversal using spin current only (ΔPMA=0). Points 1403 correspond with a ferromagnetic reversal using spin current plus ΔPMA of 45 kJ/m$^3$. Points 1404 correspond with a skyrmion reversal using spin current plus ΔPMA of 45 kJ/m$^3$. Points 1405 correspond with a ferromagnetic reversal using spin current plus ΔPMA of 90 kJ/m$^3$. Points 1406 correspond with a skyrmion reversal using spin current plus ΔPMA of 90 kJ/m$^3$.

The critical current needed for reversal of the fixed skyrmion is substantially reduced in the hybrid cases, although the critical switching time increases. Also, with similar level of current, reduction in PMA results in faster switching. This reversal is compared with ferromagnetic reversal in a system with same PMA but no DMI. When only spin current induces reversal (i.e., no VCMA is considered), the skyrmionic reversal takes a longer time (FIG. 14) than does the ferromagnet reversal without DMI. Furthermore, critical current density is almost 3 times smaller for the ferromagnetic case (not shown in FIG. 14). However, the skyrmionic reversal shows an improved performance in the hybrid scheme (i.e., VCMA+STT). The skyrmion switching in the case with highest VCMA (ΔPMA=90 kJ/m$^3$) takes place approximately three times faster (10 ns vs. 30 ns) than the ferromagnetic reversal for current densities of $5\times10^9$ A/m$^2$. The critical current density for ferromagnetic reversal and skyrmionic reversal are also of similar level in this hybrid scheme (for cases using VCMA); for a fixed switching time ~15 ns the current required to switch the skyrmion is 2.5 times smaller than the current required to switch the ferromagnet with the same VCMA (ΔPMA=90 kJ/m$^3$). The concomitant write energy (I$^2$R loss) would therefore show a 6.25 times improvement. For switching times of ~10 ns, the write energy for the skyrmion reversal in the system with DMI may be ~8 times less than for the ferromagnetic reversal in the system without DMI. Hence, one could write three times as fast at the same critical current. Alternatively, one could write with one order of magnitude less energy for the same switching time. Furthermore, if considering conventional spin transfer torque (STT) devices without VCMA or DMI, then the current density to switch in ~5 ns is $5\times10^{10}$ A/m$^2$ (not shown in FIG. 14) while the corresponding current density to switch in 5 ns for the skyrmion with VCMA is ~$1\times10^{10}$ A/m$^2$. Thus, the best case reduction in current density for switching in ~5 ns is about 5 times which can result in 25 times less energy dissipation.

Figure 15:
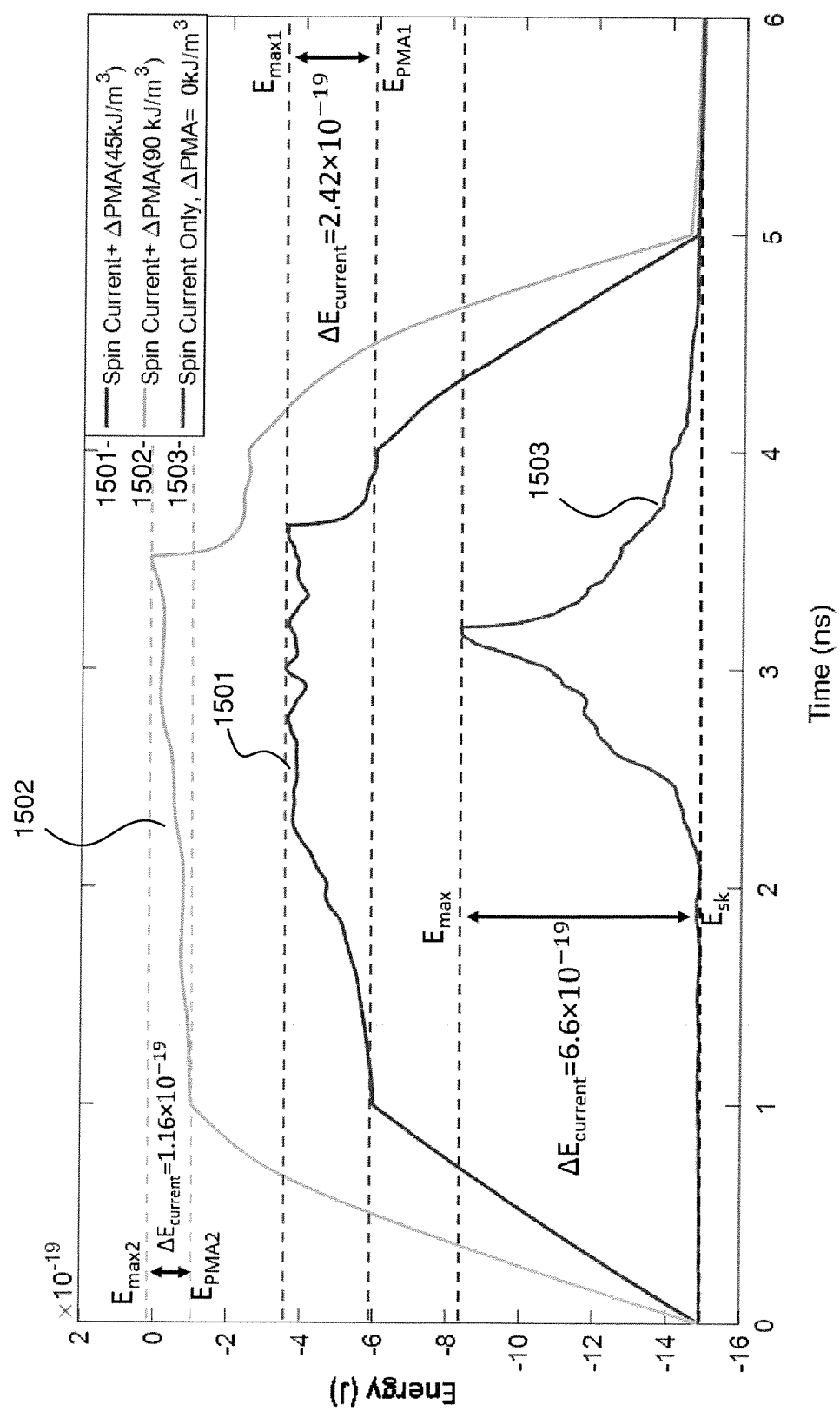
FIG. 15 shows energy profiles for the summation of exchange, DMI, magnetostatic, and anisotropy energies along the switching path according to three different switching schemes of an exemplary prototype.

To explain the reduction in critical current density, it's useful to calculate the energy barrier that is surpassed during the switching process. Magnetization vectors along the switching path in an interval of 1 picosecond were taken. From this, the exchange, DMI, magnetostatic and anisotropy energies at each point were calculated. FIG. 15 shows the energy profiles that are the summation of exchange, DMI, magnetostatic, and anisotropy energies along the switching path according to three different switching schemes. Curve 1501 describes switching with spin current plus ΔPMA of 45 kJ/m$^3$. Curve 1502 describes switching with spin current plus ΔPMA of 90 kJ/m$^3$. Curve 1503 describes switching with spin current only. Each energy profile is calculated according to the following equation:

$$E_{total}=E_{magnetostatic}+E_{DMI}+E_{exchange}+E_{anisotropy}$$

The energy barrier (ΔE) is found by taking the difference in energy between skyrmionic state and the highest energy state in the switching path:

$$\Delta E=E_{max}-E_{sk}$$

In FIG. 15, the barrier height increases with increasing ΔPMA, which is counter-intuitive and contrary to the reduction in critical current density. However, the energy barrier for nonzero ΔPMA can be divided into two regions. The first region is dominated by PMA reduction as oscillation due to current is negligible in this region. Thereafter, oscillation to due PMA reduction tapers off and oscillation due to spin current increases in magnitude which enables overcoming of the barrier, and reversal occurs. We write, $$\Delta E = (E_{PMA} - E_{sk}) + (E_{max} - E_{PMA}) = \Delta E_{PMA} + \Delta E_{current}$$

where $E_{PMA}$ is the energy of the state when voltage reaches its peak value (e.g., 1 ns), $\Delta E_{PMA}$ is the energy barrier that is overcome by the VCMA, and $\Delta E_{current}$ is the effective barrier that is overcome by the spin current.

For $\Delta PMA = 45$ kJ/m$^3$, there was a 2.72 times reduction in effective barrier height. In the case of transformation from skyrmionic state to a radial vortex state ($\Delta PMA = 90$ kJ/m$^3$) this barrier height reduces by 5.68 times. This explains the large reduction in current to switch the skyrmions with VCMA. Although the total barrier height increases, energy expended in overcoming $\Delta E_{PMA}$ is negligible since it is achieved through VCMA compared to required energy to overcome $\Delta E_{current}$ which is accomplished through the more dissipative spin transfer torque based write process. Therefore, total energy dissipation is reduced in this hybrid switching scheme.

The modulation of the interface anisotropy energy is given by $\Delta PMA = aE$, where a and E are respectively the coefficient of electric field control of magnetic anisotropy and the applied electric field. The coefficient of electric field control of magnetic anisotropy is defined as, $$a = \frac{\Delta PMA \times t_{CoFe}}{\Delta V / t_{Mgo}}$$

The theoretical reported value of "a" is 250 µJ/m$^2$ per V/nm. Thus, with a 1 nm thick free layer and 1 nm thick MgO layer, 90 kJ/m$^3$ change in the anisotropy energy density can be obtained applying 0.36 volt. The energy required to charge the capacitive MgO layer (relative permittivity $\approx 7$, thickness $\approx 1$ nm, diameter $\approx 200$ nm) is 0.864 fJ which is negligible compared to the typical write energy in conventional spin transfer torque (STT) devices. Thus, the use of VCMA in conjunction with spin current to switch fixed skyrmion based memory devices may result in an order of magnitude smaller energy dissipation compared to switching conventional STT devices or voltage assisted reversal of ferromagnets.

Embodiments described herein, or features thereof, are advantageously suited to accommodate with present and future developments in related technologies such as state of the art materials with improved coefficients of electric field control of perpendicular anisotropy. Likewise, exemplary embodiments and features disclosed herein are suited to accommodate future material science advances such as new materials that can form skyrmions at room temperature and/or demonstrate large magnetoelastic coefficients which enable switching with voltage generated strain or acoustic waves. One may also use VCMA or strain to reduce the spin transfer torque (STT) or spin orbit torque (SOT) write currents involved in switching fixed skyrmions with appropriate designs.

While exemplary embodiments of the present invention have been disclosed herein, one skilled in the art will recognize that various changes and modifications may be made without departing from the scope of the invention as defined by the following claims.

We claim:

1. A method of switching between states of a non-volatile magnetic element that has four stable states, comprising one or more of:

switching the element from a first skyrmion state to a first ferromagnetic state by applying a first voltage waveform of a first polarity that increases the perpendicular magnetic anisotropy (PMA) present at an interface of a free layer and oxide layer of the element;

switching the element from the first ferromagnetic state to a second skyrmion state by applying a second voltage waveform of a second polarity that decreases the PMA present at the interface, wherein the second polarity is of opposite polarity to the first polarity;

switching the element from the second skyrmion state to a second ferromagnetic state by applying a third voltage waveform of the first polarity that increases the PMA present at the interface; and switching the element from the second ferromagnetic state to the first skyrmion state by applying a fourth voltage waveform of the second polarity that decreases the PMA present at the interface, wherein the first skyrmion state, the second skyrmion state, the first ferromagnetic state, and the second ferromagnetic state are all stable states in an absence of an applied voltage or external magnetic field bias.

2. The method of claim 1, wherein the stable states are one or more of thermally stable and stable in the presence of magnetic fields.

3. The method of claim 1, wherein each switching step is performed in an absence of a spin current or external magnetic field bias.

4. The method of claim 1, wherein the element the state of which is switched by the method is configured to be a memory, Boolean, or non-Boolean element.

5. A method of switching between states of a non-volatile magnetic element, comprising applying a first voltage waveform of a first polarity that eliminates a first skyrmion state by increasing the perpendicular magnetic anisotropy (PMA) present at an interface of a free layer and oxide layer of the element; and applying a second voltage waveform of a second polarity that creates a second skyrmion state by decreasing the PMA at the interface, wherein the second polarity is of opposite polarity to the first polarity.

6. The method of claim 5, wherein switching is accomplished only with voltage control of magnetic anisotropy.

7. The method of claim 5, wherein switching is accomplished without spin current or an external magnetic field.

8. The method of claim 5, wherein the first and second voltage waveforms are each unipolar waveforms or separate parts of a bipolar waveform.

9. The method of claim 5, wherein the element the state of which is switched by the method is configured to be or configured to be a part of a memory element, a Boolean element, or a non-Boolean element.

10. A method of switching a non-volatile magnetic element comprising a magneto tunneling junction (MTJ) structure that includes an interface of a free layer with an oxide layer, the method comprising applying a unipolar voltage waveform across the MTJ structure, the unipolar voltage waveform reducing a perpendicular magnetic anisotropy (PMA) of the interface such that an initial ferromagnetic state of a free layer of the MTJ structure changes to an intermediate skyrmionic state; and removing the applied unipolar voltage waveform to restore the PMA to an original value, the removal annihilating the intermediate skyrmionic state and stabilizing a final ferromagnetic state that has opposite polarity of the original ferromagnetic state.

11. The method of claim 10, wherein the applying and removing steps are performed in an absence of a spin current or external magnetic field bias.

12. The method of claim 10, further comprising a step of providing a ferromagnetic fixed layer in the MTJ structure.

13. The method of claim 10, wherein the element the state of which is switched by the method is configured to be or configured to be a part of a memory element, a Boolean element, or a non-Boolean element.

14. A method of switching a non-volatile magnetic element comprising a magneto tunneling junction (MTJ) structure that includes an interface of a free layer with an oxide layer, the method comprising applying a unipolar voltage waveform across the MTJ structure, the unipolar voltage waveform increasing a perpendicular magnetic anisotropy (PMA) of the interface such that an initial skyrmionic state of a free layer of the MTJ structure is annihilated and the free layer takes an intermediate ferromagnetic state; and removing the applied unipolar voltage waveform to restore an original PMA and stabilize a final skyrmionic state that has opposite polarity of the original skyrmionic state.

15. The method of claim 14, wherein the applying and removing steps are performed in an absence of a spin current or external magnetic field bias.

16. The method of claim 14, further comprising a step of providing a skyrmionic fixed layer in the MTJ structure.

17. The method of claim 14, wherein the element the state of which is switched by the method is configured to be or configured to be a part of a memory element, a Boolean element, or a non-Boolean element.

18. A method of switching a non-volatile magnetic element comprising a magneto tunneling junction (MTJ) structure that includes an interface of a free layer with an oxide layer, the method comprising controlling a perpendicular magnetic anisotropy (PMA) of the interface with a voltage waveform applied across the MTJ structure, said voltage waveform temporarily reducing the PMA and reducing a switching current from an initial value to a reduced value; and switching a free layer of the MTJ structure between two skyrmionic states using a current that is equal to or greater than the reduced value and less than the initial value.

19. The method of claim 18, wherein the PMA is reduced irrespective of the polarity of the voltage waveform.

20. The method of claim 18, wherein the controlling and switching steps are performed in an absence of a magnetic field bias.

21. The method of claim 18, wherein the element the state of which is switched by the method is configured to be or configured to be a part of a memory element, a Boolean element, or a non-Boolean element.

22. A method of switching between states of a non-volatile magnetic element, comprising applying a first voltage waveform of a first polarity that eliminates a first ferromagnetic state by decreasing the perpendicular magnetic anisotropy (PMA) present at an interface of a free layer and oxide layer of the element; and applying a second voltage waveform of a second polarity that creates a second ferromagnetic state by increasing the PMA at the interface, wherein the second polarity is of opposite polarity to the first polarity.

23. The method of claim 22, wherein switching is accomplished only with voltage control of magnetic anisotropy.

24. The method of claim 22, wherein switching is accomplished without spin current or an external magnetic field.

25. The method of claim 22, wherein the first and second voltage waveforms are each unipolar waveforms or separate parts of a bipolar waveform.

26. The method of claim 22, wherein the element the state of which is switched by the method is configured to be or configured to be a part of a memory element, a Boolean element, or a non-Boolean element.

* * * * *